United States Patent
Son et al.

(10) Patent No.: US 12,057,822 B2
(45) Date of Patent: Aug. 6, 2024

(54) BULK ACOUSTIC RESONATOR

(71) Applicant: Samsung Electro-Mechanics Co., Ltd., Suwon-si (KR)

(72) Inventors: Sang Uk Son, Suwon-si (KR); Sung Wook Kim, Suwon-si (KR); Won Han, Suwon-si (KR); Jong Woon Kim, Suwon-si (KR); Jeong Hoon Ryou, Suwon-si (KR); Sang Heon Han, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 670 days.

(21) Appl. No.: 17/307,055

(22) Filed: May 4, 2021

(65) Prior Publication Data

US 2022/0239278 A1 Jul. 28, 2022

(30) Foreign Application Priority Data

Jan. 25, 2021 (KR) .................. 10-2021-0010053

(51) Int. Cl.
*H03H 9/17* (2006.01)
*H03H 9/02* (2006.01)
*H03H 9/13* (2006.01)

(52) U.S. Cl.
CPC ........ *H03H 9/173* (2013.01); *H03H 9/02015* (2013.01); *H03H 9/02157* (2013.01); *H03H 9/131* (2013.01); *H03H 9/132* (2013.01)

(58) Field of Classification Search
CPC .............. H03H 9/173; H03H 9/02015; H03H 9/02157; H03H 9/131; H03H 9/132
See application file for complete search history.

(56) References Cited

U.S. PATENT DOCUMENTS 7,161,448 B2  1/2007 Feng et al.
7,541,717 B2  6/2009 Schmidhammer
(Continued)

FOREIGN PATENT DOCUMENTS

CN  110190826 A  8/2019
CN  110896302 A  3/2020
(Continued)

OTHER PUBLICATIONS

Taiwanese Office Action issued on Nov. 25, 2021 in counterpart Taiwanese Patent Application No. 110117115 (6 pages in English, 7 pages in Taiwanese Mandarin).
(Continued)

*Primary Examiner* — Bryan P Gordon
(74) *Attorney, Agent, or Firm* — NSIP Law

(57) ABSTRACT

A bulk acoustic resonator includes a first electrode disposed on an upper side of a substrate, a piezoelectric layer disposed on an upper surface of the first electrode, and a second electrode disposed on an upper surface of the piezoelectric layer, wherein an upper surface of at least one of the first electrode and the second electrode has a recess region, wherein a depth of the recess region is D, a width of the recess region is W, and a resonance frequency is F, and ln is a natural logarithm, and wherein $[\{\ln(D*W)\}/(-0.59*F)]$ is $[[\ln\{0.008\ (\mu m)^2\}]/\{-0.59*(3.5\ GHz)\}]$ or more and $[[\ln\{0.022\ (\mu m)^2\}]/\{-0.59*(3.5\ GHz)\}]$ or less.

22 Claims, 18 Drawing Sheets

(56) References Cited

U.S. PATENT DOCUMENTS

| | | | |
|---|---|---|---|
| 9,520,855 B2 | 12/2016 | Feng et al. | |
| 9,748,925 B2 | 8/2017 | Taniguchi et al. | |
| 2014/0125202 A1* | 5/2014 | Choy | H03H 9/175 |
| | | | 310/365 |
| 2016/0142038 A1* | 5/2016 | Taniguchi | H03H 9/564 |
| | | | 333/133 |
| 2020/0083861 A1* | 3/2020 | Matsuo | H03H 9/0211 |
| 2020/0195221 A1* | 6/2020 | Ko | H03H 9/173 |
| 2020/0228089 A1* | 7/2020 | Tajic | H03H 9/131 |

FOREIGN PATENT DOCUMENTS

| | | |
|---|---|---|
| CN | 111384909 A | 7/2020 |
| CN | 111435831 A | 7/2020 |
| CN | 111900949 A | 11/2020 |
| EP | 3 905 520 A1 | 11/2021 |
| KR | 10-2020-0072904 A | 6/2020 |
| KR | 10-2020-0088224 A | 7/2020 |
| TW | 202029644 A | 8/2020 |

OTHER PUBLICATIONS

Korean Office Action issued on Mar. 16, 2023, in counterpart Korean Patent Application No. 10-2021-0010053 (6 pages in English, 5 pages in Korean).

\* cited by examiner

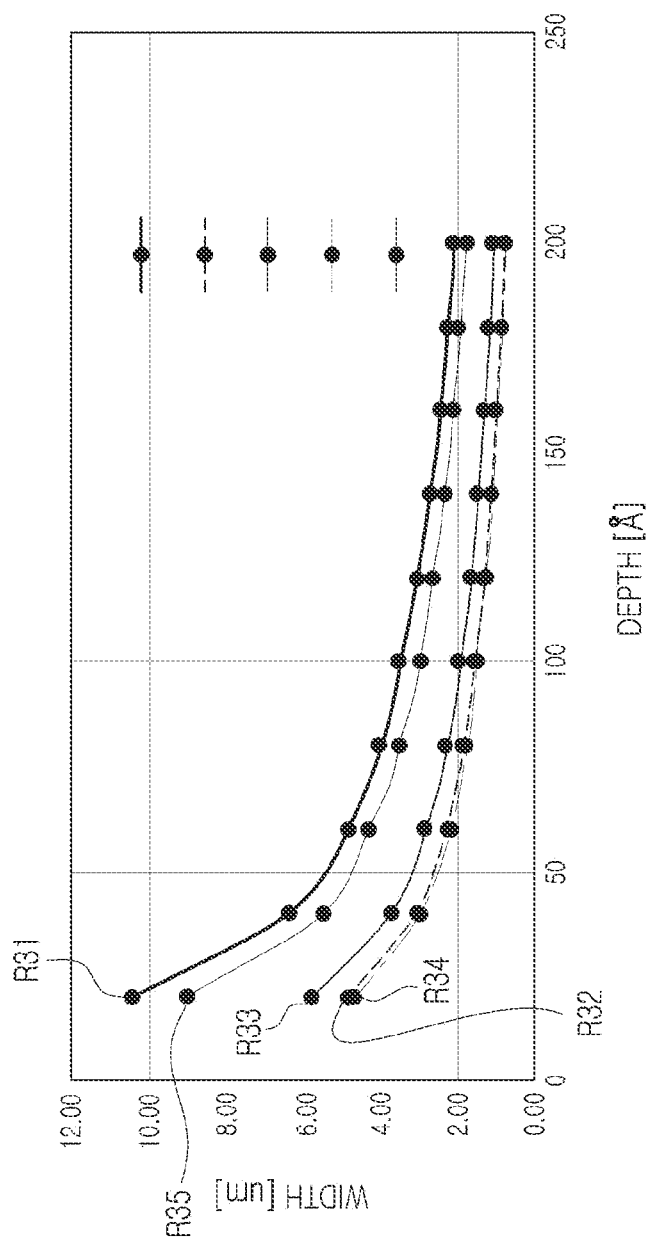

BULK ACOUSTIC RESONATOR

CROSS-REFERENCE TO RELATED APPLICATIONS

This application claims the benefit under 35 USC 119(a) of Korean Patent Application No. 10-2021-0010053 filed on Jan. 25, 2021, in the Korean Intellectual Property Office, the entire disclosure of which is incorporated herein by reference for all purposes.

BACKGROUND

1. Field

The present disclosure relates to a bulk acoustic resonator.

2. Description of the Background

Demand for a bulk acoustic wave (BAW) filter using a BAW resonator is gradually increasing as the performance of mobile devices increases, and such a filter can have advantages of high withstand power characteristics and high frequency, compared to a surface acoustic wave (SAW) filter.

Among performances required for mobile devices, low loss is important. To this end, a band low-loss design of a filter may be important, and use of a low-loss resonator is most effective. The loss of the BAW resonator has various causes, including dielectric loss of a piezoelectric body, incomplete crystallinity of the piezoelectric body itself, and resistance of electrode materials. In addition, spurious noise (SN), occurring in a proximity frequency region before reaching a resonance frequency, is also a major cause of loss of a resonator, a physical phenomenon accompanying a BAW resonance phenomenon.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In a first general aspect, a bulk acoustic resonator includes a first electrode disposed on an upper side of a substrate, a piezoelectric layer disposed on an upper surface of the first electrode, and a second electrode disposed on an upper surface of the piezoelectric layer, wherein an upper surface of at least one of the first electrode and the second electrode has a recess region, wherein a depth of the recess region is D, a width of the recess region is W, a resonance frequency is F, and ln is a natural logarithm, and wherein $[\{\ln(D*W)\}/(-0.59*F)]$ is $[[\ln\{0.008\ (\mu m)^2\}]/\{-0.59*(3.5\ GHz)\}]$ or more and $[[\ln\{0.022\ (\mu m)^2\}]/\{-0.59*(3.5\ GHz)\}]$ or less.

$D*W$ may be 0.008 $(\mu m)^2$ or more and 0.022 $(\mu m)^2$ or less.

$D*W$ may be 0.010 $(\mu m)^2$ or more and 0.016 $(\mu m)^2$ or less.

D may be 5 nm or more.

D may be 1% or more of a thickness of the piezoelectric layer.

The recess region may be located on an upper surface of the second electrode, and D may be $5/174$ times a thickness of the second electrode or more and less than a thickness of the second electrode.

Each of the first electrode and the second electrode may include molybdenum (Mo).

The upper surface of the piezoelectric layer may have a recess region, and a product of depth and width of the recess region of at least one of the first electrode and the second electrode may be less than a product of depth and width of the recess region of the piezoelectric layer.

The bulk acoustic resonator may further include a protective layer disposed on the upper surface of the second electrode, wherein an upper surface of the protective layer may have a recess region, and the product of depth and width of the recess region of the piezoelectric layer may be less than a product of depth and width of the recess region of the protective layer.

The bulk acoustic resonator may further include a seed layer disposed on the lower surface of the first electrode, wherein an upper surface of the seed layer may have a recess region, and the product of a depth and a width of a recess region of the protective layer may be less than a product of a depth and a width of the recess region of the seed layer.

The seed layer may include AlN, and the protective layer may include $SiO_2$.

In another general aspect, a bulk acoustic resonator includes a first electrode disposed on an upper side of a substrate, a piezoelectric layer disposed on an upper surface of the first electrode, and a second electrode disposed on an upper surface of the piezoelectric layer, wherein the upper surface of the piezoelectric layer has a recess region, a depth of the recess region is D, a width of the recess region is W, a resonance frequency is F, and ln is a natural logarithm, wherein D is 1% or more and less than 100% of a thickness of the piezoelectric layer, and wherein $[\{\ln(D*W)\}/(-0.412*F)]$ is $[[\ln\{0.015\ (\mu m)^2\}]/\{-0.412*(3.5\ GHz)\}]$ or more and $[[\ln\{0.03\ (\mu m)^2\}]/\{-0.412*(3.5\ GHz)\}]$ or less.

$D*W$ may be 0.015 $(\mu m)^2$ or more and 0.03 $(\mu m)^2$ or less.

The bulk acoustic resonator may further include a seed layer disposed on the lower surface of the first electrode, wherein an upper surface of the seed layer may have a recess region, and a product of depth and width of the recess region of the piezoelectric layer may be less than a product of depth and width of the recess region of the seed layer.

In another general aspect, a bulk acoustic resonator includes a seed layer, a first electrode disposed on an upper surface of the seed layer, a piezoelectric layer disposed on an upper surface of the first electrode, a second electrode disposed on an upper surface of the piezoelectric layer, and a protective layer disposed on an upper surface of the second electrode, wherein upper surfaces of at least two of the seed layer, the first electrode, the piezoelectric layer, the second electrode, and the protective layer have first and second recess regions having different products of depth and width, respectively.

The first recess region may be located on an upper surface of at least one of the first electrode and the second electrode, the second recess region may be located on an upper surface of at least one of the seed layer, the piezoelectric layer, and the protective layer, and a product of depth and width of the first recess region may be less than a product of depth and width of the second recess region.

Each of the first electrode and the second electrode may include molybdenum (Mo), and at least one of the seed layer, the piezoelectric layer, and the protective layer may include at least one of AlN, ScAlN, and $SiO_2$.

The first recess region may be located on an upper surface of at least one of the first electrode, the piezoelectric layer, and the second electrode, the second recess region may be located on an upper surface of at least one of the seed layer and the protective layer, and a product of depth and width of the first recess region may be less than a product of depth and width of the second recess region.

The first recess region may be located on an upper surface of at least one of the first electrode, the piezoelectric layer, the second electrode, and the protective layer, the second recess region may be located on the upper surface of the seed layer, and a product of depth and width of the first recess region may be less than a product of depth and width of the second recess region.

The first and second recess regions may have different depths.

Other features and aspects will be apparent from the following detailed description, the drawings, and the claims.

BRIEF DESCRIPTION OF DRAWINGS

FIGS. 6C and 6D are graphs illustrating an optimal area curve of a recess region located on upper surfaces of a seed layer, a first electrode, a piezoelectric layer, a second electrode, and a protective layer.

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1:
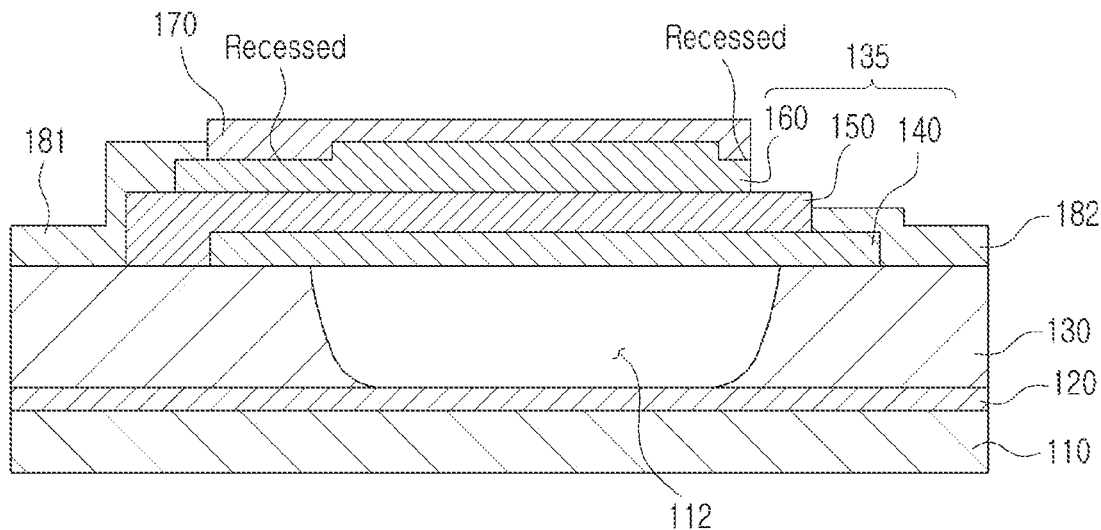
FIG. 1 is a view illustrating a recess region of a bulk acoustic resonator (bulk acoustic wave resonator) according to an embodiment of the present disclosure.

Hereinafter, while example embodiments of the present disclosure will be described in detail with reference to the accompanying drawings, it is noted that examples are not limited to the same.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of functions and constructions that would be well known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Herein, it is noted that use of the term "may" with respect to an example or embodiment, for example, as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or a part of the whole element less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," "lower," and the like may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of this disclosure. Further, although the examples described herein have a variety of configurations, other configurations are possible as will be apparent after an understanding of this disclosure.

An aspect of the present disclosure is to provide a bulk acoustic resonator.

FIG. 1 is a view illustrating a recess region of a bulk acoustic resonator (bulk acoustic wave resonator) according to an embodiment of the present disclosure.

Referring to FIG. 1, a bulk acoustic resonator according to an embodiment of the present disclosure may include a resonator 135, and the resonator 135 may include a first electrode 140, a piezoelectric layer 150, and a second electrode 160.

The first electrode 140 may be disposed on an upper side of a substrate 110, the piezoelectric layer 150 may be disposed on an upper surface of the first electrode 140, and the second electrode 160 may be disposed on an upper surface of the piezoelectric layer 150.

Each of the first and second electrodes 140 and 160 may be formed using a conductive material such as molybdenum (Mo) or an alloy thereof to improve coupling efficiency with the piezoelectric layer 150, but is not limited thereto. Each of the first and second electrodes 140 and 160 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

The piezoelectric layer 150 may include a piezoelectric material to generate a piezoelectric effect converting electrical energy into mechanical energy in a form of elastic waves. For example, the piezoelectric material may include one of aluminum nitride (AlN), zinc oxide (ZnO), and lead zirconate titanate (PZT; PbZrTiO), may further include rare earth metal and transition metal, and may also include magnesium (Mg), divalent metal. For example, the rare earth metal may include at least one of scandium (Sc), erbium (Er), yttrium (Y), and lanthanum (La). The transition metal may include at least one of titanium (Ti), zirconium (Zr), hafnium (Hf), tantalum (Ta), and niobium (Nb).

The resonator 135 may convert electrical energy of a radio frequency (RF) signal into mechanical energy through a piezoelectric characteristic of the piezoelectric layer 150 and inversely convert it. As a frequency of the RF signal is closer to a resonance frequency of the bulk acoustic resonator, an energy transfer rate between the first and second electrodes 140 and 160 can be greatly increased. As the frequency of the RF signal is closer to an anti-resonance frequency of the bulk acoustic resonator, the energy transfer rate between the first and second electrodes 140 and 160 can be greatly reduced. According to the piezoelectric characteristic, the anti-resonance frequency may be higher than the resonance frequency.

Referring to FIG. 1, the bulk acoustic wave resonator according to an embodiment of the present disclosure may be a thin film bulk acoustic resonator (FBAR) in which an air cavity 112 is located between the substrate 110 and the resonator 135, but is not limited thereto. For example, the bulk acoustic wave resonator according to an embodiment of the present disclosure may be a solidly mounted resonator (SMR) type resonator in which a support portion in which at least one insulating layer and at least one metal layer are alternately stacked is located between the substrate 110 and the resonator 135.

Referring to FIG. 1, a bulk acoustic wave resonator according to an embodiment of the present disclosure may further include at least one of a substrate 110, an insulating layer 120, a sacrificial layer 130, a protective layer 170, and metal layers 181 and 182.

The substrate 110 may be composed of a conventional silicon substrate or a silicon substrate having high specific resistance, and an insulating layer 120 may be provided on an upper surface of the substrate 110 to electrically isolate the substrate 110 and the resonator 135. The insulating layer 120 may be formed on the substrate 110 through any one process of chemical vapor deposition, RF magnetron sputtering, and evaporation of at least one of silicon dioxide ($SiO_2$), and aluminum oxide ($Al_2O_3$).

An air cavity 112 may be disposed on the insulating layer 120. The air cavity 112 may be located below the resonator 135 so that the resonator 135 can vibrate in a predetermined direction. The air cavity 112 may be formed by a process of forming a sacrificial layer 130 on the insulating layer 120, forming a membrane on the sacrificial layer 130, and then etching and removing a portion of the sacrificial layer 130.

A seed layer for improving crystal orientation of the piezoelectric layer 150 may be additionally disposed below the first electrode 140. For example, the seed layer may be formed of one of aluminum nitride (AlN), zinc oxide (ZnO), lead zirconium titanium oxide (PZT; PbZrTiO) having the same crystallinity as the piezoelectric layer 150.

A protective layer 170 may be disposed on the second electrode 160 of the resonator 135 to prevent the second electrode 160 from being exposed externally. The protective layer 170 may be formed of one of a silicon oxide-based, a silicon nitride-based, and an aluminum nitride-based insulating material.

Metal layers 181 and 182 may be an electrical node between a plurality of bulk acoustic resonators or an electrical connection node between a bulk acoustic resonator and a connection port, and may be implemented with a material having relatively low specific resistance such as gold (Au), a gold-tin (Au—Sn) alloy, copper (Cu), a copper-tin (Cu—Sn) alloy, aluminum (Al), aluminum alloy, and the like, but is not limited thereto.

An upper surface of at least one of the first and second electrodes 140 and 160 of the bulk acoustic resonator according to an embodiment of the present disclosure may include at least one recess region.

Figure 2:
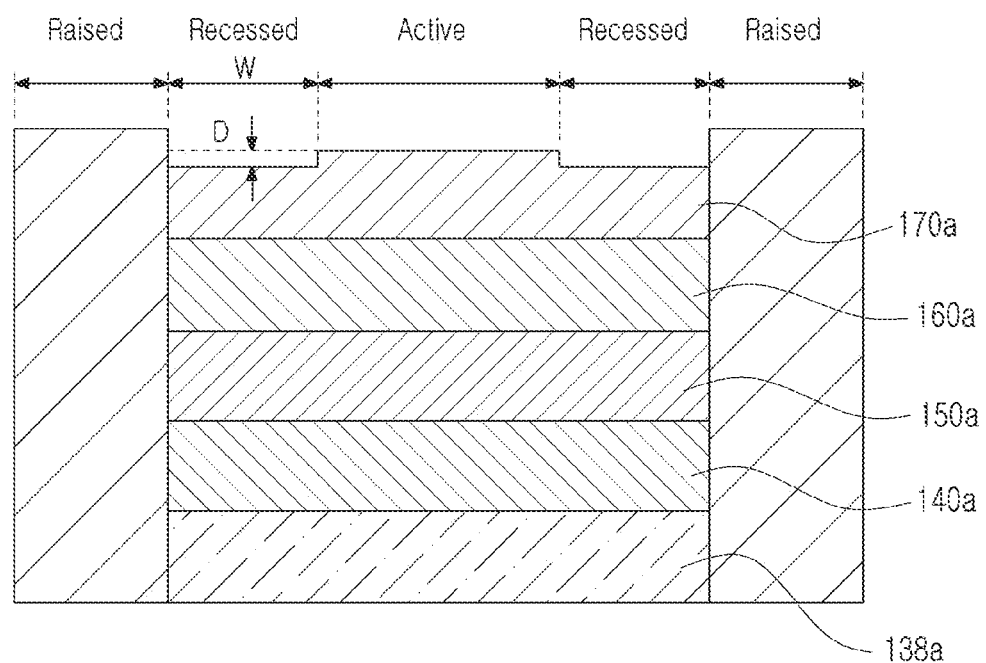
FIG. 2 is a view illustrating a width and a depth of a recess region of a bulk acoustic resonator according to an embodiment of the present disclosure.

FIG. 2 is a view illustrating a width and a depth of a recess region of a bulk acoustic resonator according to an embodiment of the present disclosure.

Referring to FIG. 2, one surface (an inner surface or an outer surface) of the bulk acoustic resonator according to an embodiment of the present disclosure may include a recess region (Recessed) and an active region (Active), and may further include a raised region (Raised).

The recess region may have a depth D corresponding to a vertical direction and a width W corresponding to a horizontal direction. For example, the depth D may be an average depth of the recess region, and the width W may be an average distance between one side surface of the active region and one side surface of the raised region.

For example, the recess region may have a trench shape two-dimensionally surrounding the active region. When the recess region has a trench shape, the two recess regions of a cross-section obtained by cutting the bulk acoustic resonator in the vertical direction may be the same as one three-dimensional recess region. Here, the depth D and the width W of the recess region may be an average of depths and widths of each of the two recess regions of a cross-section obtained by cutting the bulk acoustic resonator in the vertical direction.

A side surface of the raised region may provide a portion of a vertical boundary surface of the recess region. The raised region may be the same component as the component (e.g., an electrode) in which the recess region is formed, and may correspond to the recess region and to the portion other than the active region remaining on one surface of the bulk acoustic resonator. Depending on the design, the raised region may also be a component (e.g., an electrode), different from a component (e.g., a metal layer) in which a recess region is formed.

A side surface of the active region may provide a portion of a vertical boundary surface of the recess region. A height of the active region may be lower than a height of the raised region, but is not limited thereto.

For example, a bulk acoustic resonator of a Type II may have a structure in which the recess region is adjacent to the active region and is located outwardly thereof, and the raised region is adjacent to the recess region and is located outwardly thereof, and a Type I bulk acoustic resonator may have a structure in which the raised region is adjacent to the active region and is located outwardly thereof, and the recess region is adjacent to the raised region and is located outwardly thereof.

A magnitude relationship of a resonance frequency of the recess region, the raised region, and the active region (a cutoff frequency corresponding to kx=0 in a dispersion curve) may be a relationship of [Fcutoff_recessed]>[Fcutoff_active]>[Fcutoff_raised]. Accordingly, the raised region and the recess region may be defined as a difference in physical thickness from the active region, but more fundamentally, may also be defined as a region having a difference in resonance frequency for each type. For example, although the recess region, raised region, and active regions have the same thickness in appearance, they may be distinguished from each other by having different resonance frequencies or cutoff frequencies by a method in which different types of materials are stacked.

Referring to FIG. 2, a bulk acoustic resonator according to an embodiment of the present disclosure may include a seed layer 138a, a first electrode 140a, a piezoelectric layer 150a, a second electrode 160a, and a protective layer 170a. The recess region may be formed in at least one of the seed layer 138a, the first electrode 140a, the piezoelectric layer 150a, the second electrode 160a, and the protective layer 170a.

FIGS. 3A to 3E are views illustrating a recess region of a bulk acoustic resonator according to embodiments of the present disclosure.

Figure 3A:
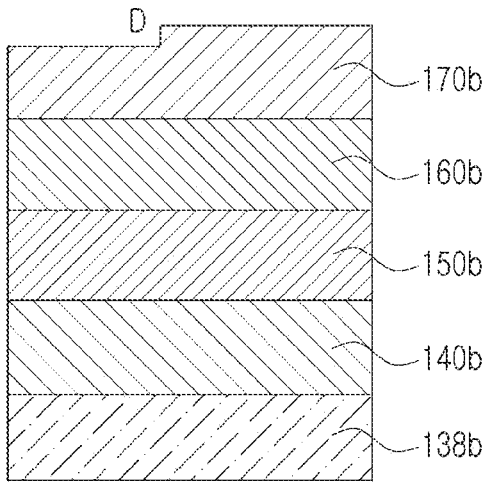
FIGS. 3A to 3E are views illustrating a recess region of a bulk acoustic resonator according to embodiments of the present disclosure.

Referring to FIG. 3A, a recess region having a depth D may only be formed on a protective layer 170b among a seed layer 138b, a first electrode 140b, a piezoelectric layer 150b, a second electrode 160b, and a protective layer 170b.

Figure 3B:
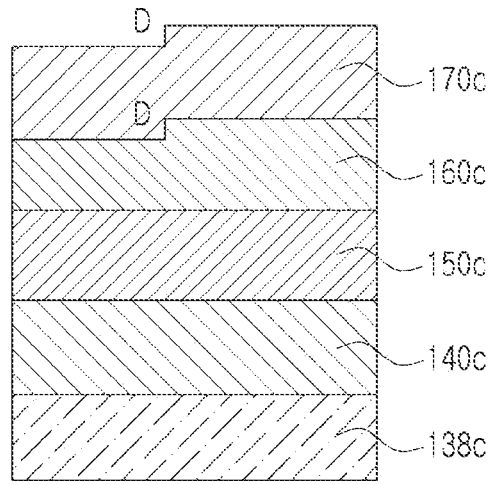

Referring to FIG. 3B, a recess region having a depth D may only be formed on a protective layer 170c and a second electrode 160c among a seed layer 138c, a first electrode 140c, a piezoelectric layer 150c, a second electrode 160c, and a protective layer 170c. For example, the protective layer 170c may be deposited at a uniform thickness over the entire area on the second electrode 160c in which the recess region is formed.

Figure 3C:
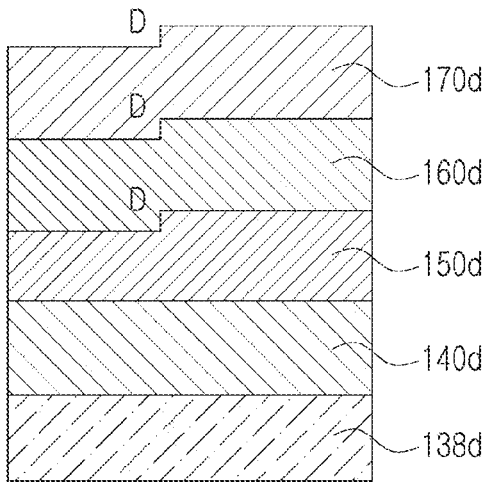

Referring to FIG. 3C, a recess region having a depth D may only be formed on a protective layer 170d, a second electrode 160d, and a piezoelectric layer 150d among a seed layer 138d, a first electrode 140d, a piezoelectric layer 150d, a second electrode 160d, and a protective layer 170d.

Figure 3D:
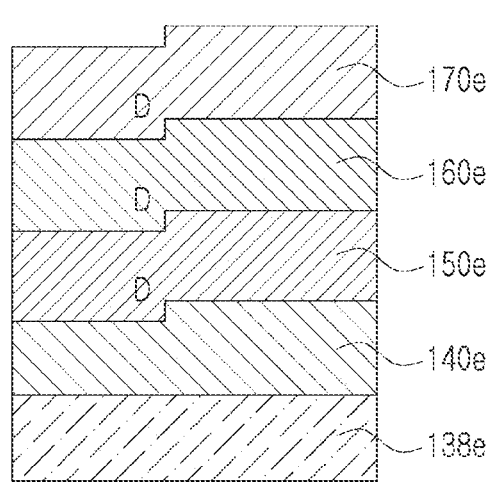

Referring to FIG. 3D, a recess region having a depth D may only be formed on a protective layer 170e, a second electrode 160e, a piezoelectric layer 150e, and a first electrode 140e among a seed layer 138e, a first electrode 140e, a piezoelectric layer 150e, a second electrode 160e, and a protective layer 170e.

Figure 3E:
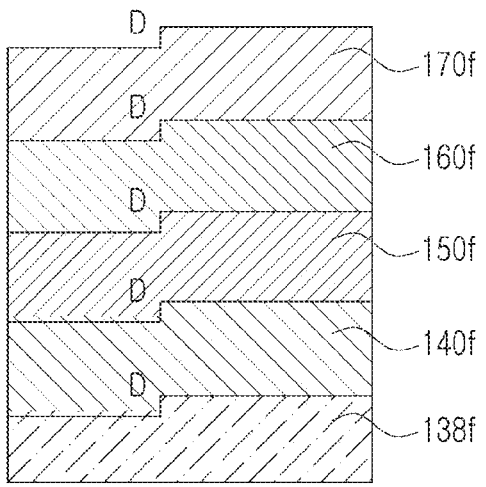

Referring to FIG. 3E, a recess region having a depth D may be formed on each of a seed layer 138f, a first electrode 140f, a piezoelectric layer 150f, a second electrode 160f, and a protective layer 170f.

For example, the first electrode 140f, the piezoelectric layer 150f, the second electrode 160f, and the protective layer 170f may be deposited at a uniform thickness over the entire area on the seed layer 138f in which the recess region is formed. That is, the bulk acoustic resonator according to an embodiment of the present disclosure may have a plurality of recess regions formed in different surfaces.

FIGS. 4A to 4E are views illustrating a difference in depths between a plurality of recess regions of a bulk acoustic resonator according to embodiments of the present disclosure.

Figure 4A:
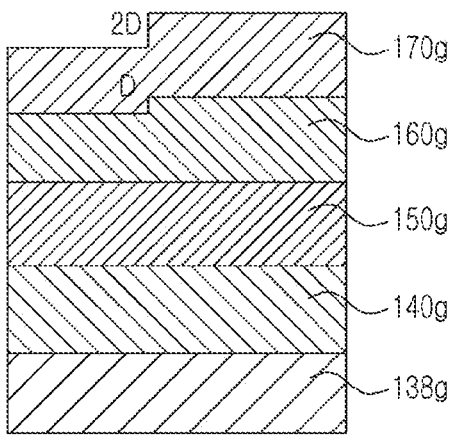
FIGS. 4A to 4E are diagrams illustrating depth differences between a plurality of recess regions of a bulk acoustic resonator according to embodiments of the present disclosure.

Referring to FIG. 4A, a recess region having a deep depth (2D) may be formed on a protective layer 170g among a seed layer 138g, a first electrode 140g, a piezoelectric layer 150g, a second electrode 160g, and the protective layer 170g. The recess region having a depth D may be formed in the second electrode 160g. For example, the protective layer 170g may be deposited on the second electrode 160g in which a recess region having a depth D is formed with a difference in thickness of the depth D.

Figure 4B:
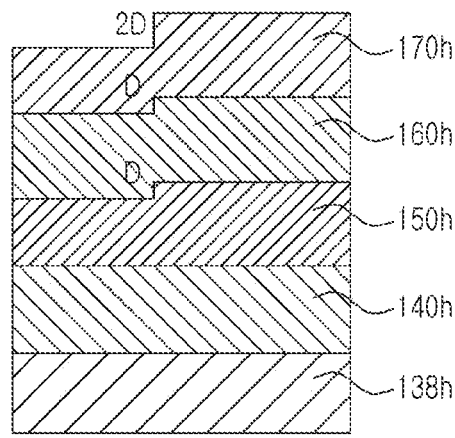

Referring to FIG. 4B, the recess region having a deep depth (2D) may be formed on the protective layer 170h among the seed layer 138h, the first electrode 140h, the piezoelectric layer 150h, the second electrode 160h, and the protective layer 170h, and the recess region having a depth D may be formed in the second electrode 160h and the piezoelectric layer 150h.

Figure 4C:
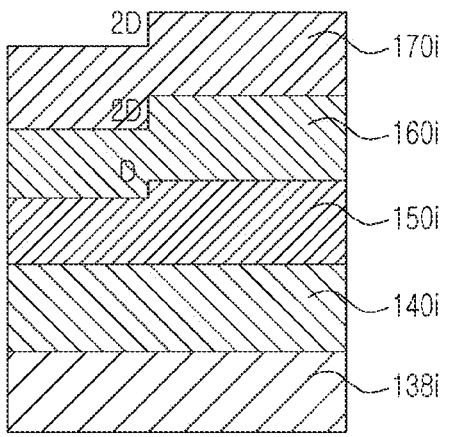

Referring to FIG. 4C, the recess region having a deep depth (2D) may be formed in the protective layer 170i and the second electrode 160i among the seed layer 138i, the first electrode 140i, the piezoelectric layer 150i, the second electrode 160i, and the protective layer 170i, and the recess region having a depth D may be formed in the piezoelectric layer 150i.

Figure 4D:
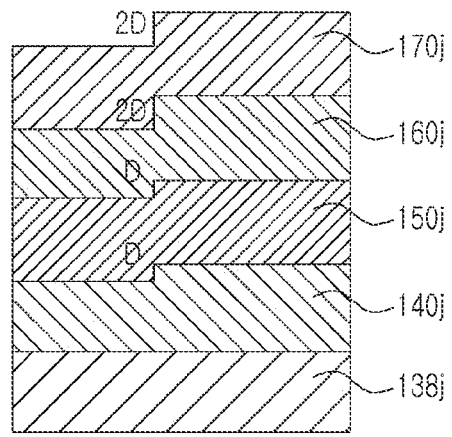

Referring to FIG. 4D, the recess region having a deep depth (2D) may be formed in the protective layer 170j and the second electrode 160j among the seed layer 138j, the first electrode 140j, the piezoelectric layer 150j, the second electrode 160j, and the protective layer 170j, and the recess region having a depth (D) may be formed in the piezoelectric layer 150j and the first electrode 140j.

Figure 4E:
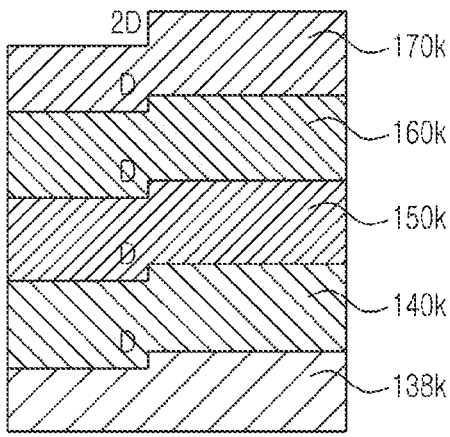

Referring to FIG. 4E, the recess region having a deep depth (2D) may be formed in the protective layer 170k, and the recess region having a depth D may be respectively formed in the seed layer 138k, the first electrode 140k, the piezoelectric layer 150k, and the second electrode 160k. For example, in the first electrode 140k, the piezoelectric layer 150k, and the second electrode 160k, the recess region having a depth D may be deposited with a uniform thickness over the entire area on the seed layer 138k in which the recess region having a depth D is formed, and the protective layer 170k may be deposited on the second electrode 160k with a difference in thickness of the depth D.

That is, the bulk acoustic resonator according to an embodiment of the present disclosure may have a plurality of recess regions formed in different surfaces and having different depths from each other. Accordingly, a product of depth and width of each of the plurality of recess regions formed in different surfaces and having different depths may be different from each other.

Referring back to FIG. 2, an acoustic wave of the raised region of the bulk acoustic resonator according to an embodiment of the present disclosure may have a vibration displacement according to Equation 1 below according to a wave equation, and an acoustic wave of the recess region may have a vibration displacement according to Equation 2 below according to a wave equation, and an acoustic wave of the active region may have a vibration displacement according to Equation 3 below.

$$U_{10}e^{j\beta_1 x} \qquad \text{Equation 1}$$

$$U_{20}\cos(\beta_2 x - \phi_2) \qquad \text{Equation 2}$$

$$U_{30} \qquad \text{Equation 3}$$

$\beta_1$ is kx(1/μm), a propagation number (or a wave number) of the raised region, $\beta_2$ is kx(1/μm), a propagation number (or a wave number) of the recess region, U is a vibration displacement constant, φ is a phase constant, and x is a coordinate in a direction corresponding to a width.

The vibration displacement and stress (including a gradient component of the vibration displacement) may be continuous at an interface between the raised and recess regions and an interface between the recessed and active regions.

Equation 4 below represents a combination of Equations 1 and 2 and wave equations in a state in which an x value at the interface between the raised and recess regions is defined as 0.

$$\text{at } x = 0 \qquad \text{Equation 4}$$
$$U_1 = U_2, \frac{\partial U_1}{\partial x} = \frac{\partial U_2}{\partial x}$$
$$U_{10} = U_{20}\cos(\phi_2)$$
$$U_{10}\beta_1 = U_{20}\beta_2\sin(\phi_2)$$
$$\phi_2 = \operatorname{atan}(\beta_1/\beta_2)$$

Equation 5 below represents a combination of Equations 2, 3, and wave equations in a state in which the x value at the interface between the recessed and active regions is defined as W.

$$\text{at } x = W \qquad \text{Equation 5}$$
$$U_2 = U_3, \frac{\partial U_2}{\partial x} = \frac{\partial U_3}{\partial x} = 0$$
$$U_{20}\cos(\beta_2 W - \phi_2) = U_{30}$$
$$-\beta_2 U_{20}\sin(\beta_2 W - \phi_2) = 0$$
$$W = ((n-1)\pi + \phi_2)/\beta_2$$

According to Equations 4 and 5, the width W may be a result value of a function in which φ2 and β2 are applied as variables, and φ2 may be a result value of a function in which β1 and β2 are applied as variables.

As the width of the recess region is closer to the width according to Equations 4 and 5, the active region is in a piston mode state with substantially no surface acoustic waves, thereby suppressing spurious resonance, in the raised region, energy leakage may be suppressed by attenuating acoustic waves, and the recess region may further smoothly connect between the active region and the recess region.

For example, as the width of the recess region is closer to the width according to Equations 4 and 5, spurious noise in a frequency range, lower than the resonance frequency of the bulk acoustic resonator may decrease, the resonance frequency can be formed more sharply, and an insertion loss near the resonance frequency can be reduced. Accordingly, a skirt characteristic of a filter including a bulk acoustic resonator may be improved, and an energy loss (e.g., an insertion loss and a return loss) may be further reduced.

Figure 5:
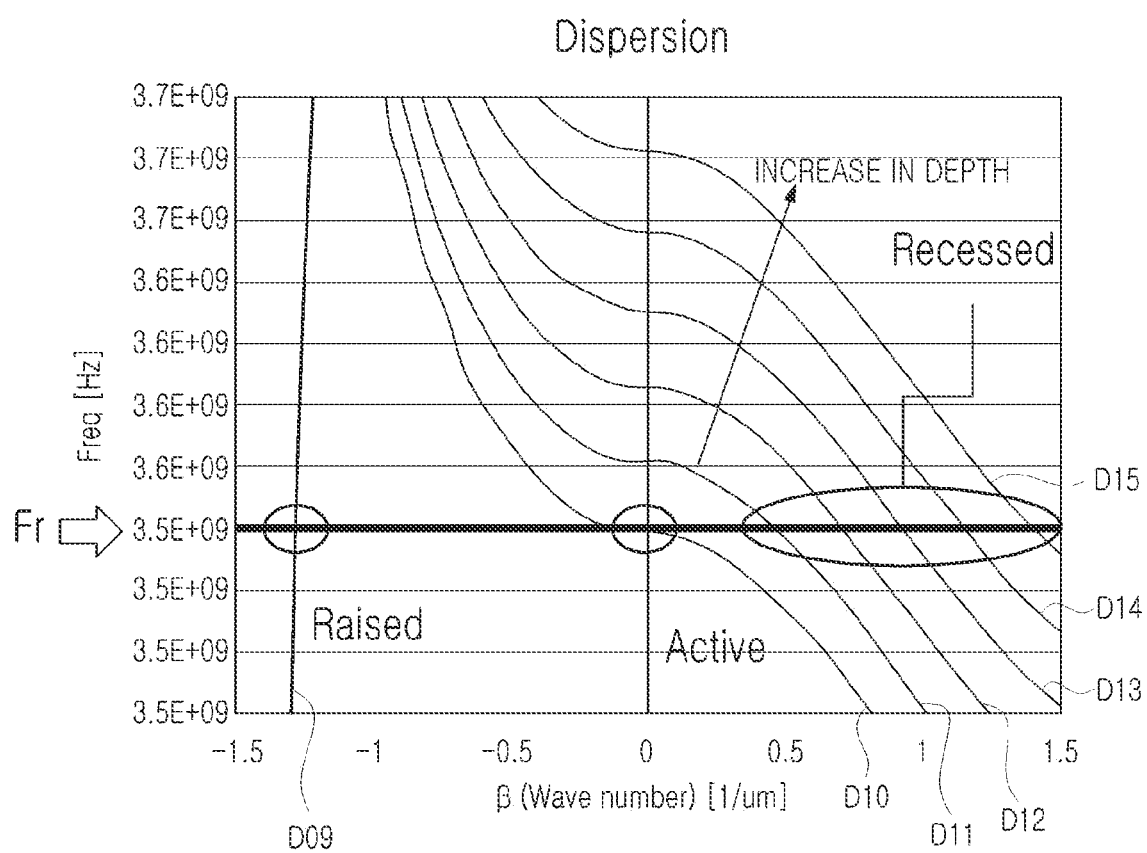
FIG. 5 is a graph illustrating an increase in an acoustic wave number as the depth of a plurality of recess regions increases.

FIG. 5 is a graph illustrating an increase in an acoustic wave number as the depth of a plurality of recess regions increases.

D09 of FIG. 5 represents a dispersion curve, a change curve of the wave number (β1) according to the frequency (Freq) of the raised region, D10 represents a dispersion curve, a change curve of the wave number according to the frequency (Freq) of the active region, D11 represents a dispersion curve, a change curve of the wave number (β2) according to the frequency (Freq) when the depth (D) of the recess region is the shortest, D12 represents a dispersion curve, a change curve of the wave number (β2) according to the frequency (Freq) when the depth (D) of the recess region is the second shortest, D13 represents a dispersion curve, a change curve of the wave number (β2) according to the frequency (Freq) when the depth (D) of the recess region is the third shortest, D14 denotes a dispersion curve, a change curve of the wave number (β2) according to the frequency (Freq) when the depth (D) of the recess region is the fourth shortest, and D15 denotes a dispersion curve, a change curve of the wave number (β2) according to the frequency (Freq) when the depth (D) of the recess region is the fifth shortest.

The wave number is a physical value that can be determined by physical properties and thickness of a corresponding region, and may correspond to kx (a propagation number). When kx is negative, it means an imaginary value of a complex number (real+imaginary number). That is, the real number of kx means the vibration of the acoustic wave, the imaginary number of kx means the attenuation of the acoustic wave, and the complex number of kx means that the acoustic wave is attenuated as it vibrates.

Referring to FIG. 5, the wave number of the active region at 3.5 GHz may be 0, the wave number of the raised region at 3.5 GHz may be a negative number, and the wave number of the recess region at 3.5 GHz may be a positive number, and the wave number may increase as the depth of the recess region increases.

Figure 6A:
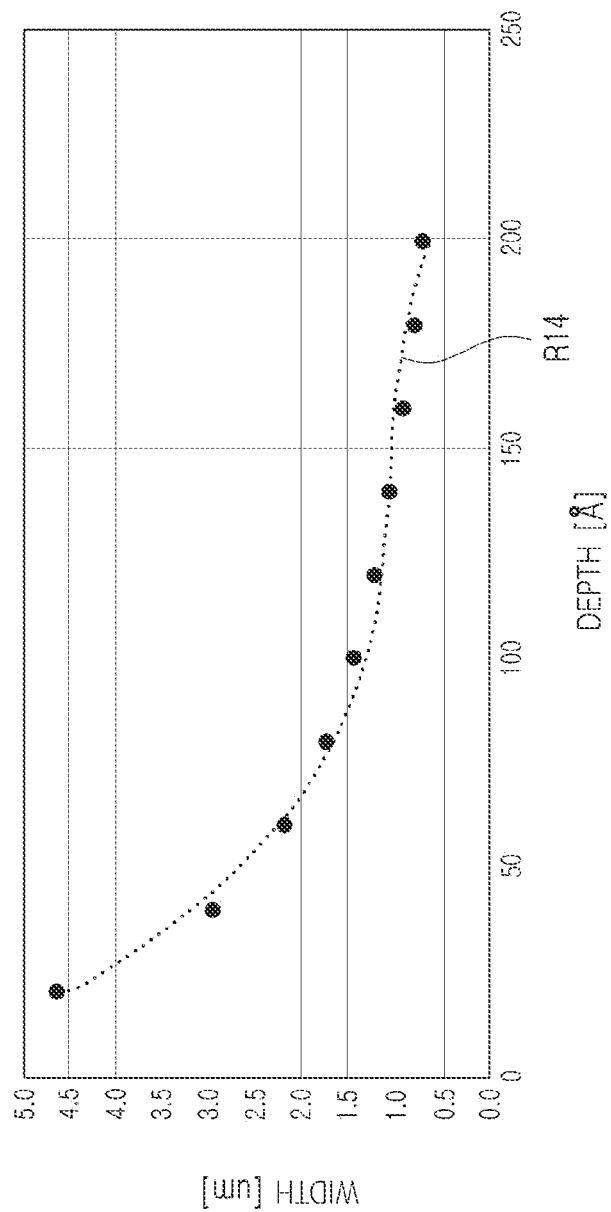
FIGS. 6A and 6B are graphs illustrating an optimal area curve of a recess region located on an upper surface of a second electrode.
Figure 6B:
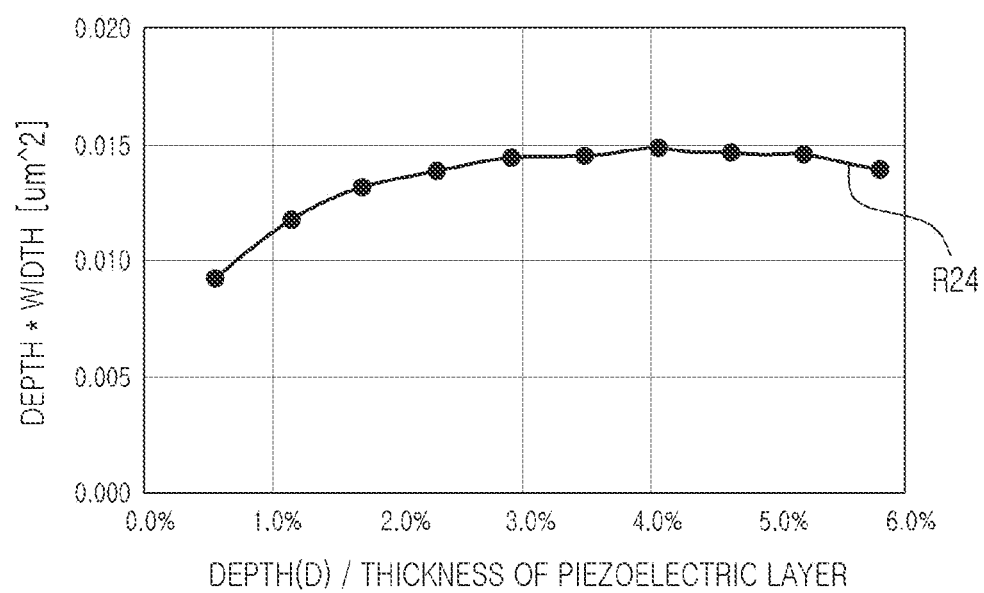

FIGS. 6A and 6B are graphs illustrating an optimal area curve of a recess region located on an upper surface of a second electrode.

When the wave number at a specific frequency (e.g., 3.5 GHz) of FIG. 5 is applied to Equations 4 and 5, it can be seen that the optimal width and depth of the recess region are in inverse proportion to each other, and an optimal area curve R14 such as FIG. 6A may be obtained. Here, the optimal area means the product of the width and the depth.

Referring to FIG. 6B, since an optimal area (depth×width) in an optimal area curve R24 may be saturated at about 0.015 (μm)$^2$, an intermediate value of an optimal area range of the recess region may be 0.015 (μm)$^2$, and since a maximum deviation of the optimal area range of the recess region may be about 0.007 (μm)$^2$, the optimal area range of the recess region may be 0.008 (μm)$^2$ or more and 0.022 (μm)$^2$ or less.

FIGS. 6A and 6B illustrate values based on a structure in which a recess region is formed in the second electrode, but since the physical properties and thickness of the first electrode and the second electrode may be similar, so an optimal area curve in which the recess region is formed in the first electrode may also be similar to that of FIGS. 6A and 6B.

Accordingly, in the bulk acoustic resonator according to an embodiment of the present disclosure, by including a structure in which a recess region having a product (D*W) of a depth (D) and a width (W) of 0.008 (μm)$^2$ or more and 0.022 (μm)$^2$ or less formed in the first and second electrodes, the bulk acoustic resonator according to an embodiment of the present disclosure may have improved performance (e.g., spurious noise reduction, sharpness of an (anti)-resonance frequency, or the like) based on the width of the recess region, close to the width according to Equation 5.

Referring to FIG. 6B, when the depth D of the recess region is less than 1% of the thickness of the piezoelectric layer, the slope of the optimal area (depth×width) in the optimal area curve R24 may be relatively steep.

The depth D of the recess region may be 1% or more of the thickness of the piezoelectric layer. Accordingly, since the optimal area (depth×width) can be stable, the influence received from the dispersion of the process of manufacturing the bulk acoustic resonator can be small. However, depending on the structure, shape, material, and required standard of the bulk acoustic resonator, the depth D of the recess region may be designed to be less than 1% of the thickness of the piezoelectric layer.

Alternatively, the depth of the recess region may be 5 nm or more. Accordingly, it can be prevented that the depth of the recess region is greatly influenced by the dispersion of the process of manufacturing the bulk acoustic resonator as the depth of the recess region is too thin.

Figure 6D:
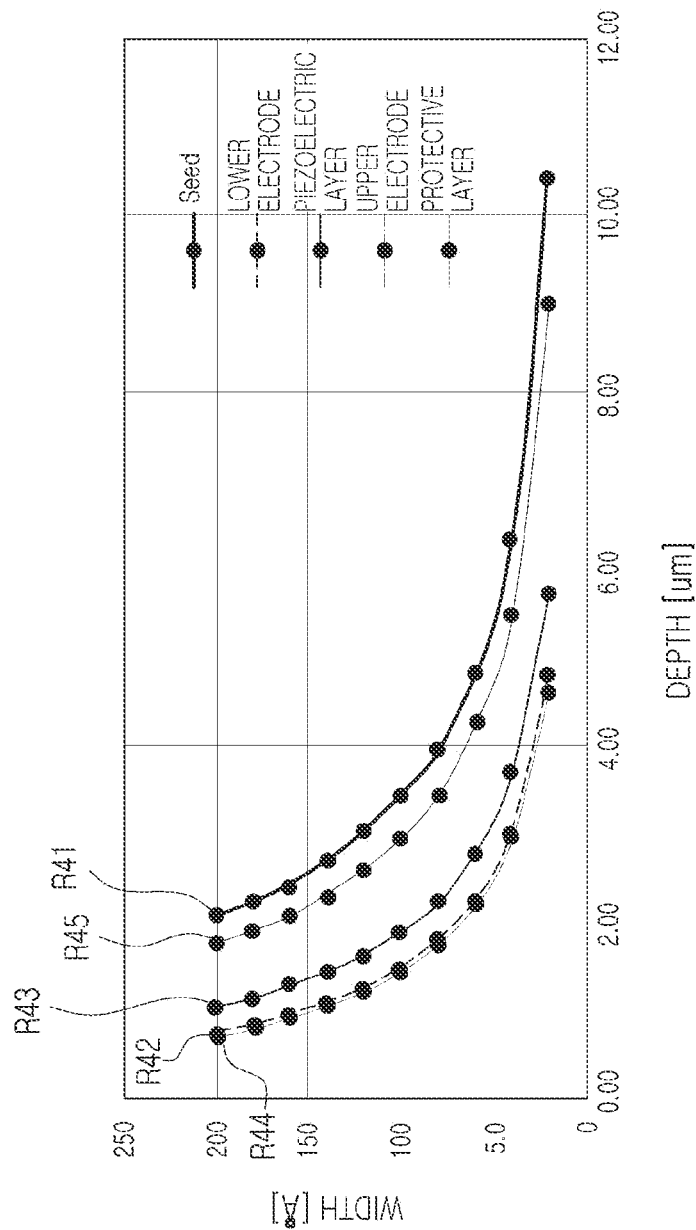

FIGS. 6C and 6D are graphs illustrating optimal area curves of recess regions located on upper surfaces of a seed layer, a first electrode (lower electrode), a piezoelectric layer, a second electrode (upper electrode), and a protective layer.

Referring to FIGS. 6C and 6D, the optimal area curves R31 and R41 of the seed layer, the optimal area curves R32 and R42 of the first electrode, the optimal area curves R33 and R43 of the piezoelectric layer, the optimal area curves R34 and R44 of the second electrode, and the optimal area curves R35 and R45 of the protective layer may be different from each other.

The optimal area curves R31 and R41 of the seed layer may be values based on the seed layer containing AlN, the optimal area curves R33 and R43 of the piezoelectric layer may be values based on the piezoelectric layer containing ScAlN, the optimal area curves R35 and R45 of the protective layer may be values based on the protective layer containing $SiO_2$, and the optimal area curves R32 and R42 of the first electrode and the optimal area curves R34 and R44 of the second electrode may be values based on the first and/or second electrodes containing molybdenum (Mo). Depending on the design, the seed layer or the protective layer may be replaced with the same material or different materials among AlN or $SiO_2$, and in this case, a relative position of the graph may also be changed. In addition, a scandium (Sc) concentration of the piezoelectric layer ScAlN can be increased from 0 at. % depending on the design.

The overall optimal area (depth×width) of the seed layer may be greater than the overall optimal area (depth×width) of the protective layer, the overall optimal area (depth×width) of the protective layer may be greater than the overall optimal area (depth×width) of the piezoelectric layer, and the overall optimal area (depth×width) of the piezoelectric layer may be greater than the overall optimal area (depth×width) of the first and/or second electrodes.

Accordingly, the bulk acoustic resonator according to an embodiment of the present disclosure may include a plurality of recess regions, and the optimal area (depth×width) of the recess region formed in the seed layer among the plurality of recess regions may be greater than the optimal area (depth×width) of the recess region formed in the protective layer, the optimal area (depth×width) of the recess region formed in the protective layer among the plurality of recess regions may be greater than the optimal area (depth×width) of the recess region formed in the piezoelectric layer, and the optimal area (depth×width) of the recess region formed in the piezoelectric layer among the plurality of recess regions may be greater than the optimal area (depth×width) of the recess region formed in the first and/or second electrodes. For example, one of the depth and width of each component may be the same, and the other may be different.

Accordingly, in the bulk acoustic resonator according to an embodiment of the present disclosure, since each of the plurality of recess regions may have a structure, close to the optimal area (depth×width), the bulk acoustic resonator may have improved performance (e.g., spurious noise reduction, sharpness of a resonance frequency, or the like) based on the width of the recess region, close to the width according to Equations 4 and 5.

Figure 7A:
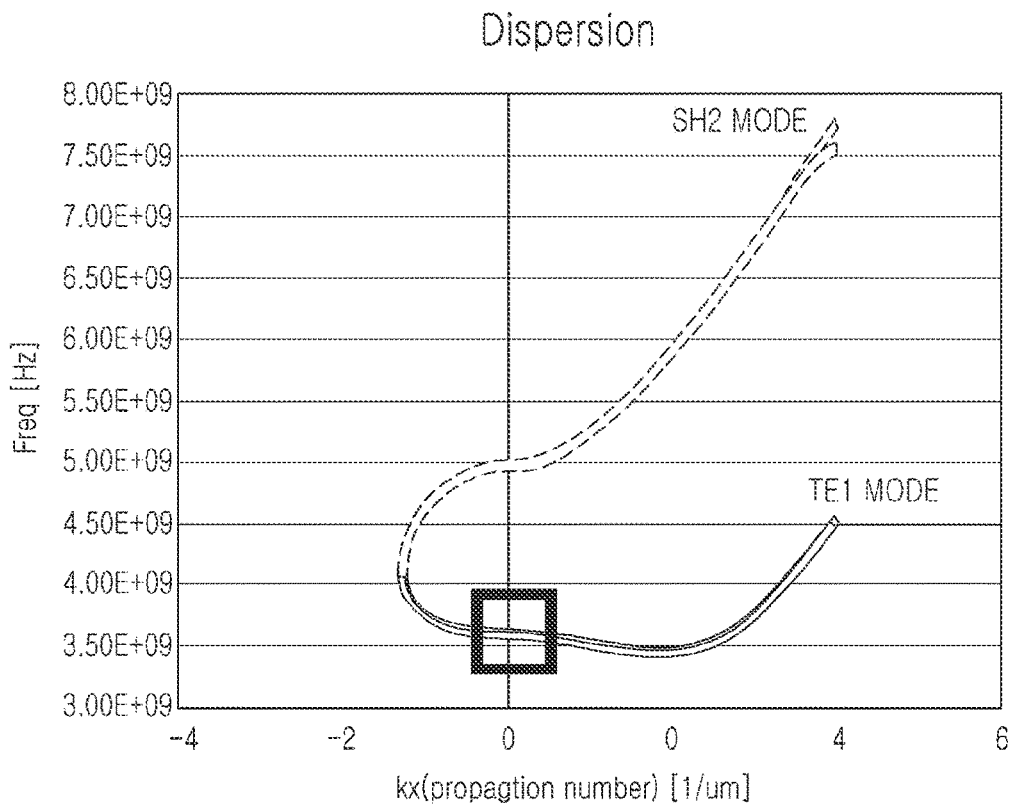
FIGS. 7A and 7B are graphs showing differences in dispersion curves compared to active when a recessed region having the same depth is formed in each of a seed layer, a first electrode, a piezoelectric layer, a second electrode, and a protective layer.
Figure 7B:
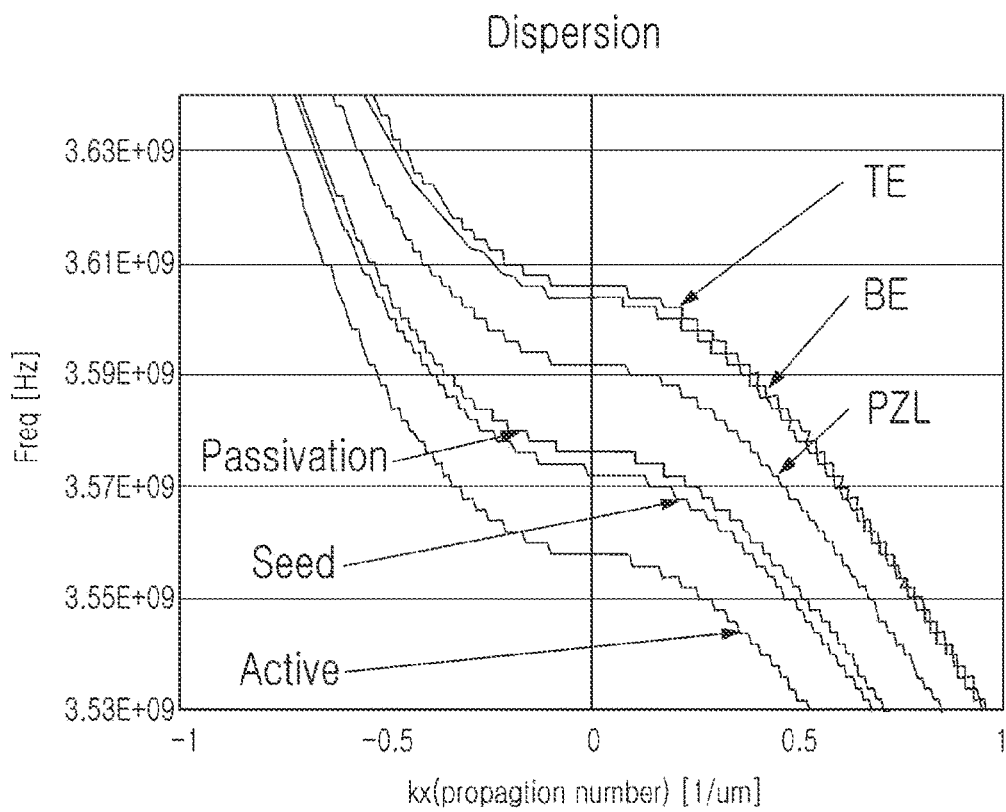

FIGS. 7A and 7B are graphs illustrating a difference in dispersion curves compared to active when a recessed region having the same depth is formed in each of a seed layer, a first electrode, a piezoelectric layer, a second electrode, and a protective layer.

Referring to FIGS. 7A and 7B, kx according to a frequency (Freq) of the active region (Active), kx according to the frequency (Freq) of the seed layer (Seed), kx according to the frequency (Freq) of the protective layer (Passivation), kx of the frequency (Freq) of the piezoelectric layer (PZL), and kx of the frequency (Freq) of the first and second electrodes BE and TE may be different from each other. The optimal area curves shown in FIGS. 6C and 6D may be a value based on this. An amount of displacement of dispersion curves is different depending on which layer the recess region is formed on, and accordingly, a value of kx meeting a cutoff frequency of the active region may be different from each other. Due to this effect, the optimal area of the recess region may be different for each layer.

A specific value of kx shown in FIGS. 7A and 7B may vary slightly depending on the position, material, density, stiffness, and thickness of each of the seed layer, the first electrode, the piezoelectric layer, the second electrode, and the protective layer, which is a value when the depth of the recess region is 10 nm.

Figure 8A:
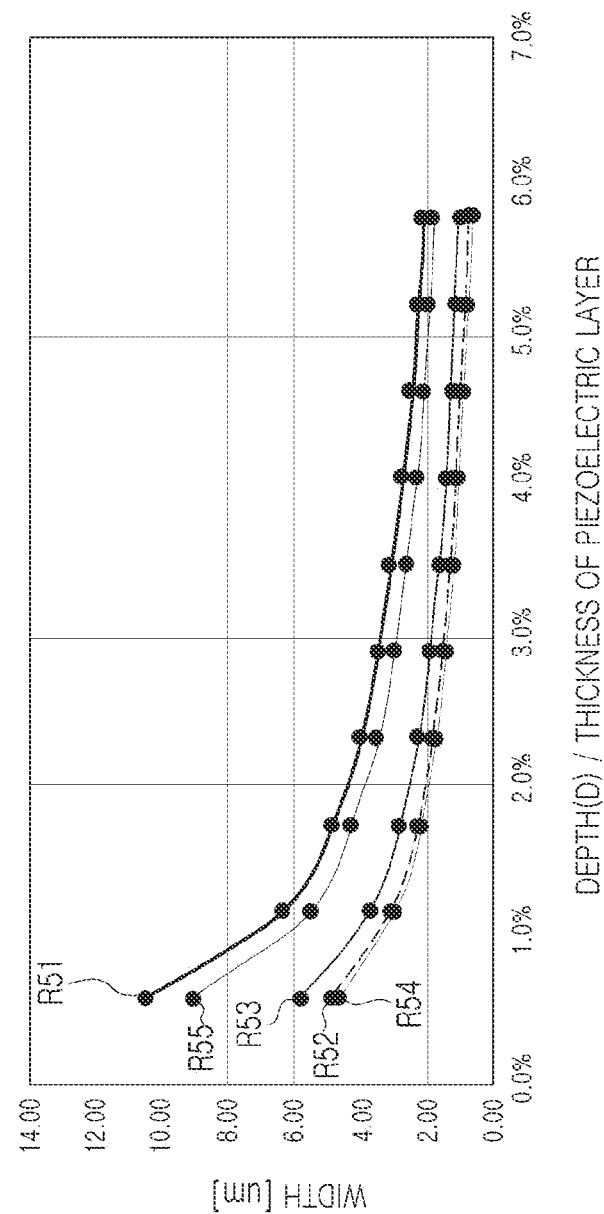
FIGS. 8A and 8B are graphs illustrating an optimal area curve in which a thickness variable of a piezoelectric layer is added to an optimal area curve of a recess region located on upper surfaces of a seed layer, a first electrode, a piezoelectric layer, a second electrode, and a protective layer.
Figure 8B:
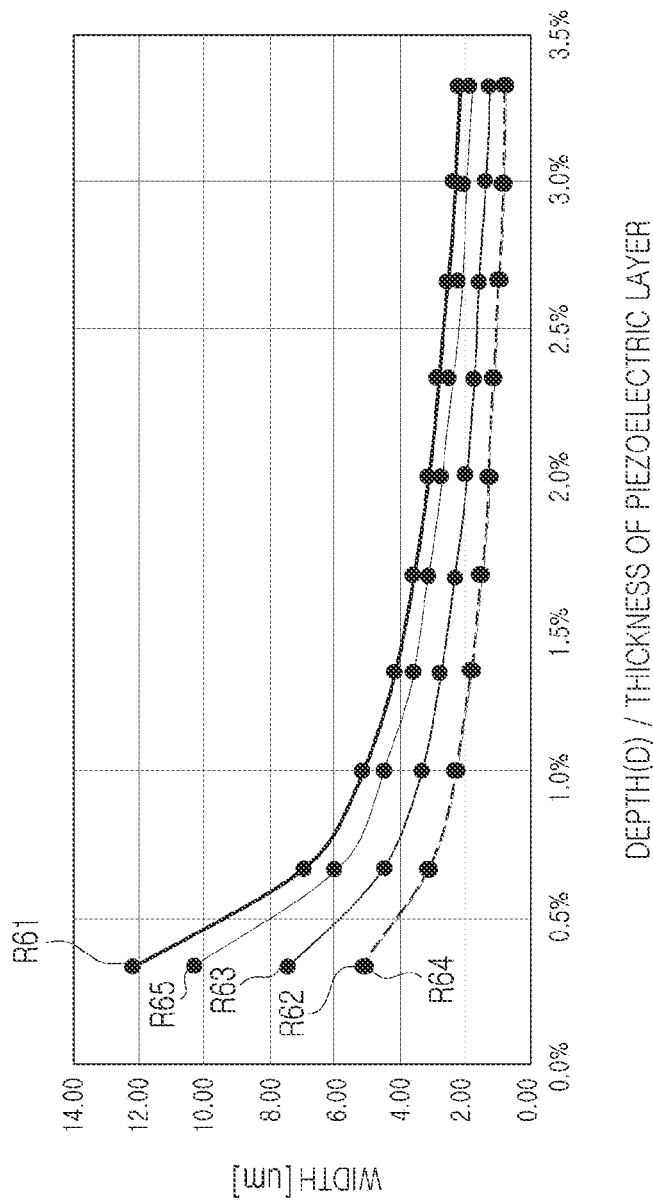

FIGS. 8A and 8B are graphs illustrating an optimal area curve in which a thickness variable of a piezoelectric layer is added to an optimal area curve of a recess region located on an upper surface of a seed layer, a first electrode, a piezoelectric layer, a second electrode, and a protective layer.

FIG. 8A illustrates an optimal area curve when a thickness of the piezoelectric layer is 345 nm, and FIG. 8B illustrates an optimal area curve when the thickness of the piezoelectric layer is 600 nm.

Referring to FIGS. 8A and 8B, optimal area curves R51 and R61 of the seed layer, optimal area curves R52 and R62 of the first electrode, optimal area curves R53 and R63 of the piezoelectric layer, optimal area curves R54 and R64 of the second electrode, and optimal area curves R55 and R65 of the protective layer may have a steep slope when a depth D of the recess region is less than 1% of thickness of the piezoelectric layer, and may have a gentle slope, when it is 1% or more the thickness of the piezoelectric layer.

That is, regardless of the location or number of the recess regions of the bulk acoustic resonator according to an embodiment of the present disclosure, the depth D of the recess region may be 1% or more of the thickness of the piezoelectric layer. Accordingly, since the optimal area (depth×width) can be stable, an influence received from a dispersion of the process of manufacturing the bulk acoustic resonator can be small. However, depending on the structure, shape, material, and required standard of the bulk acoustic resonator, the depth D of the recess region may also be designed to be less than 1% of the thickness of the piezoelectric layer.

Figure 9A:
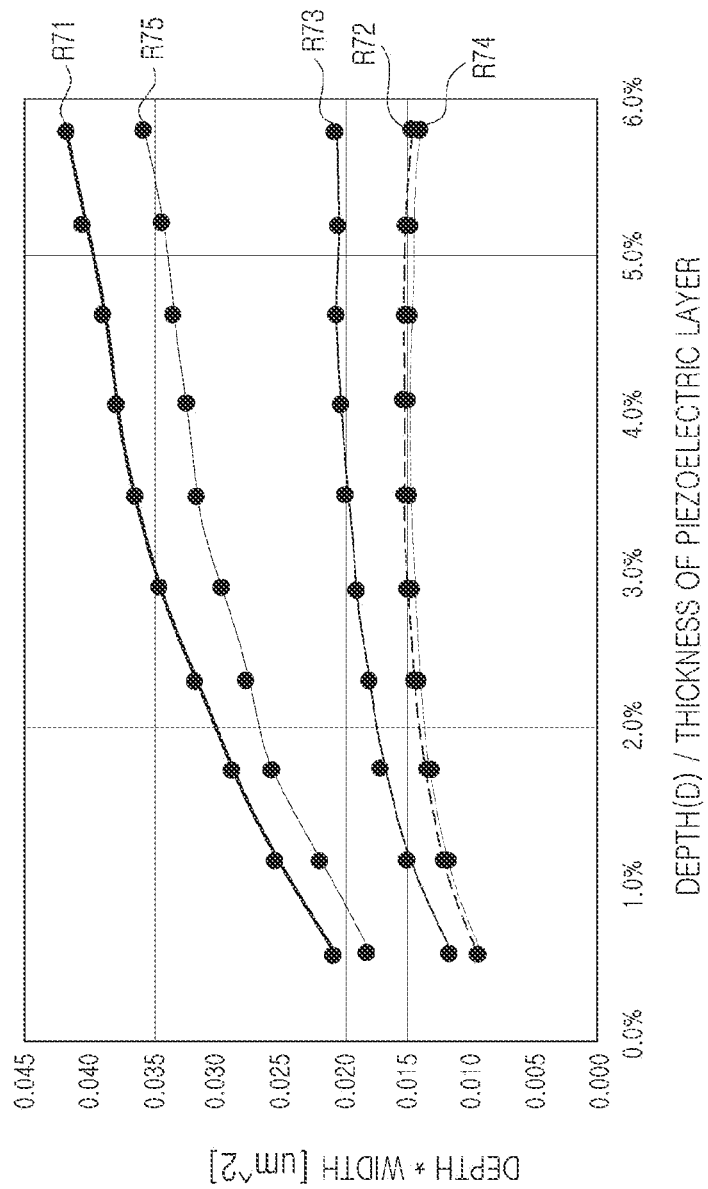
FIGS. 9A and 9B are graphs illustrating a change in an optimal area according to a depth of a recess region respectively located in upper surfaces of a seed layer, a first electrode, a piezoelectric layer, a second electrode, and a protective layer.
Figure 9B:
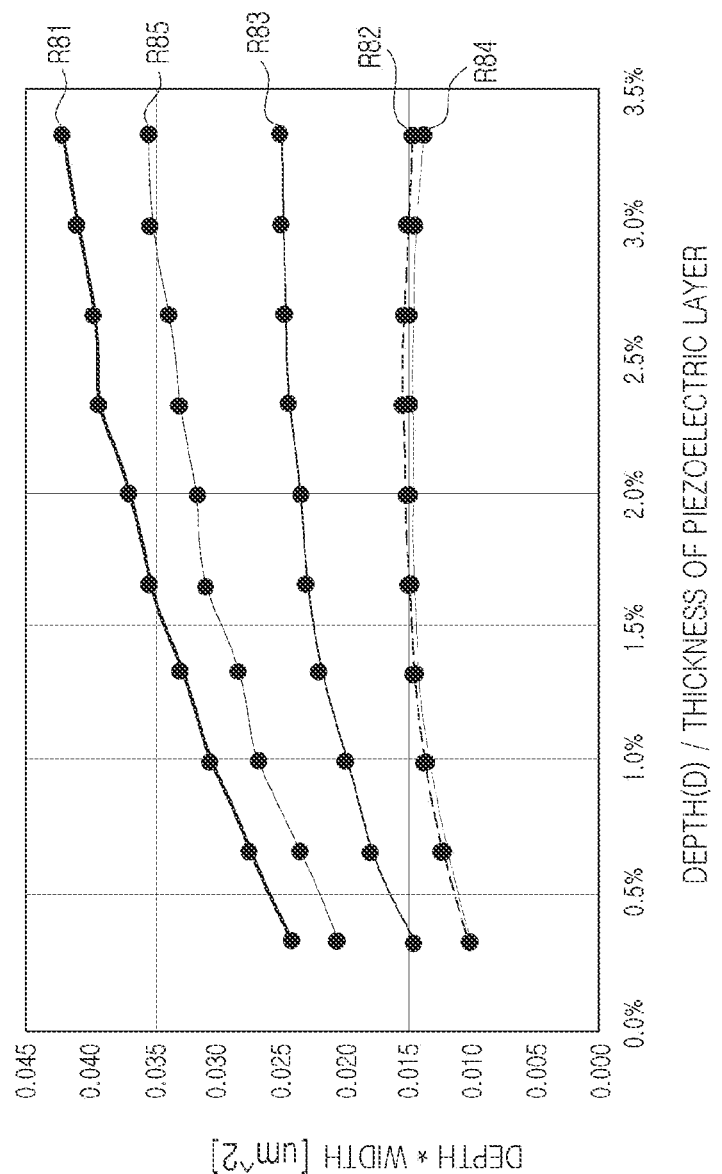

FIGS. 9A and 9B are graphs illustrating a change in an optimal area according to a depth of a recess region located on an upper surface of a seed layer, a first electrode, a piezoelectric layer, a second electrode, and a protective layer.

FIG. 9A illustrates an optimal area curve when a thickness of the piezoelectric layer is 345 nm, and FIG. 9B illustrates an optimal area curve when the thickness of the piezoelectric layer is 600 nm.

Referring to FIGS. 9A and 9B, optimal area curves R72 and R82 of the first electrode, optimal area curves R73 and R83 of the piezoelectric layer, and optimal area curves R74 and R84 of the second electrode may have characteristics of being saturated in a specific optimal area, and optimal area curves R71 and R81 of the seed layer and optimal area curves R75 and R85 of the protective layer may not have the characteristic that the optimal area is saturated, and may be saturated when the depth is deeper.

The optimal area (depth×width) in the optimal area curves R73 and R83 of the piezoelectric layer optimal area curves can be saturated between about 0.02 $(\mu m)^2$ and 0.024 $(\mu m)^2$, and since a maximum deviation of an optimal area range of the recessed range may be about 0.01 $(\mu m)^2$, the optimal area range of the recess region of the piezoelectric layer may be 0.012 $(\mu m)^2$ or more and 0.032 $(\mu m)^2$ or less.

The bulk acoustic resonator according to an embodiment of the present disclosure may include a product (D*W) of a depth (D) and a width (W) of the recess region of the piezoelectric layer of 0.012 $(\mu m)^2$ or more and 0.032 $(\mu m)^2$ or less formed in the piezoelectric layer, such that it can have improved performance based on the width of the recess region, close to the width according to Equations 4 and 5 (e.g., spurious noise reduction, sharpness of a resonance frequency, or the like).

Meanwhile, a value of the optimal area curve of FIG. 9A is a value based on a protective layer having a thickness of 130 nm, a second electrode having a thickness of 174 nm, a first electrode having a thickness of 215 nm, and a seed layer having a thickness of 57 nm, and a value of the optimal area curve of FIG. 9B is a value based on a protective layer having a thickness of 130 nm, a second electrode having a thickness of 120 nm, a first electrode having a thickness of 161 nm, and a seed layer having a thickness of 57 nm.

For example, since the thickness of the second electrode may be 174 nm or less, the depth D of the recess region formed in the upper surface of the second electrode may be $5/174$ times or more and less than the thickness of the second electrode. Accordingly, since the optimal area (depth×width) can be stable, an influence received from a dispersion of the process of manufacturing the bulk acoustic resonator can be small.

Figure 10A:
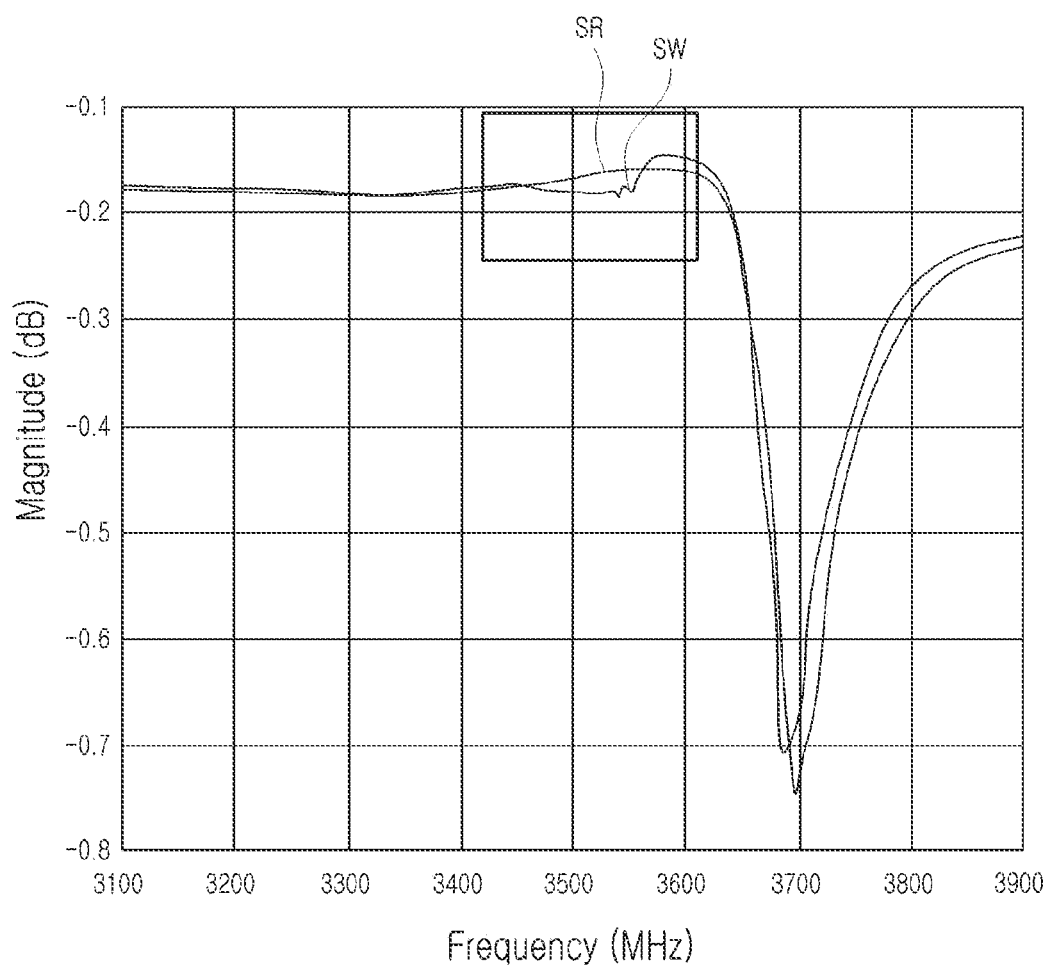
FIGS. 10A and 10B are graphs illustrating differences in spurious noise in a frequency range lower than the resonance frequency according to the presence or absence of a recess region.
Figure 10B:
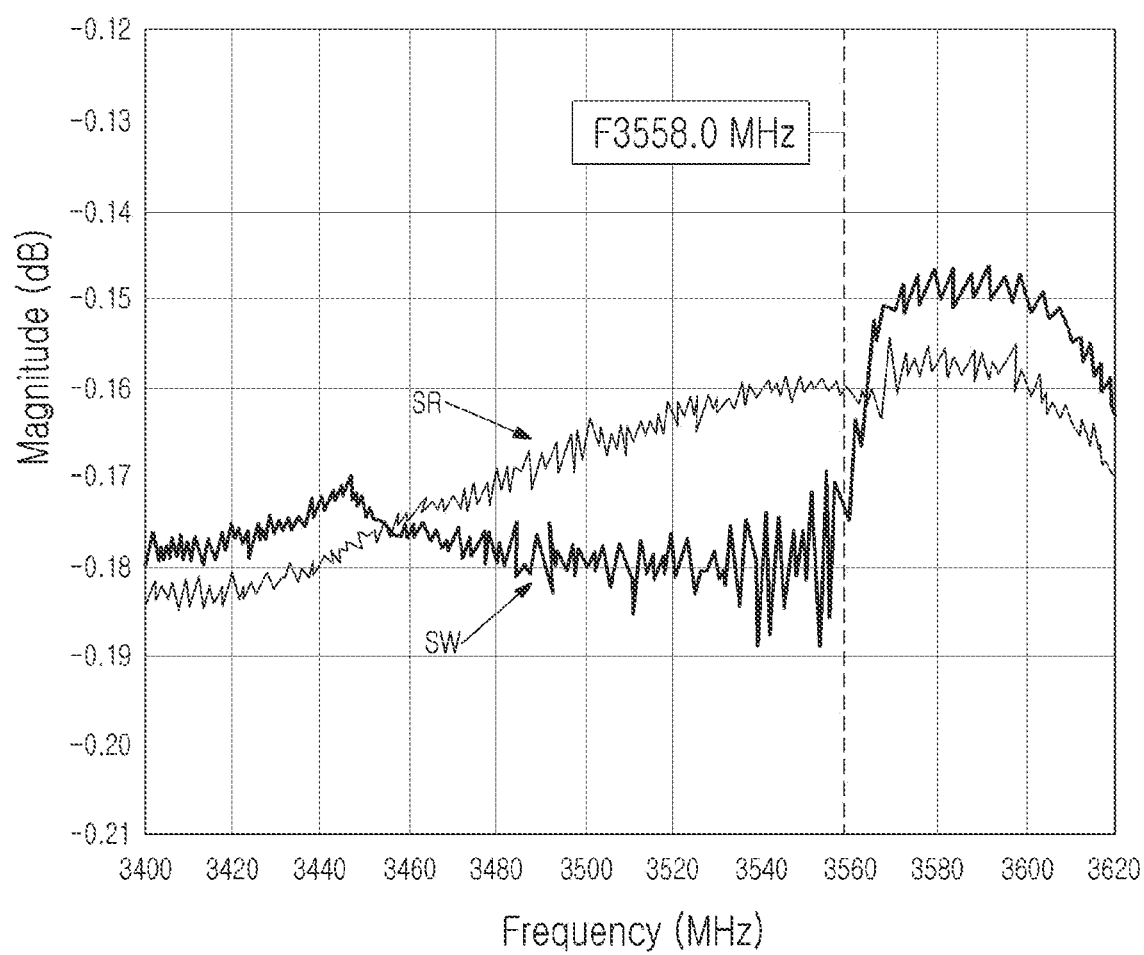

FIGS. 10A and 10B are graphs illustrating a difference in spurious noise in a frequency range, lower than the resonance frequency according to the presence or absence of a recess region.

Referring to FIGS. 10A and 10B, since an S parameter S11 (SR) of the bulk acoustic resonator having a recess region may have a ripple, smaller than that of an S parameter S11 (SW) of the bulk acoustic resonator having no recess region, it can have further lower spurious noise.

Figure 11A:
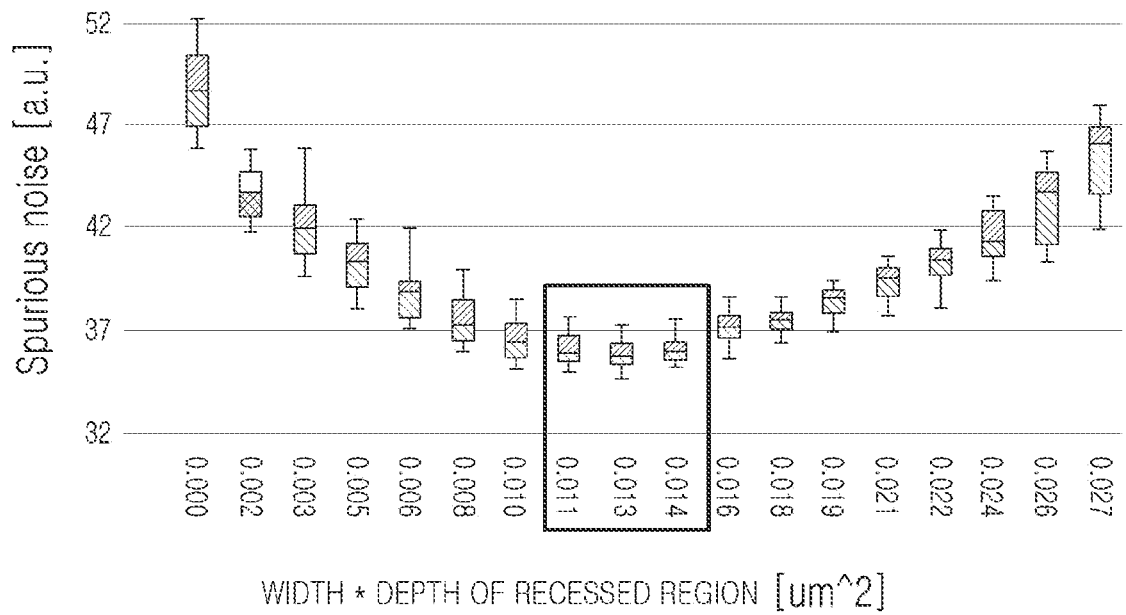
FIG. 11A is a graph illustrating spurious noise according to a product of a width and a depth of a recess region.

FIG. 11A is a graph illustrating spurious noise according to a product of a width and a depth of a recess region.

Referring to FIG. 11A, spurious noise may be the lowest when a product of width and depth of the recess regions of the first and/or second electrodes is 0.010 $(\mu m)^2$ or more and 0.016 $(\mu m)^2$ or less. Values in FIG. 11A are values based on a recess region having a depth of 8 nm.

Accordingly, the bulk acoustic resonator according to an embodiment of the present disclosure may have a recess region in which the product of the width and depth of the recess regions of the first and/or second electrode is 0.010 $(\mu m)^2$ or more and 0.016 $(\mu m)^2$ or less, so that spurious noise may be further reduced.

Figure 11B:
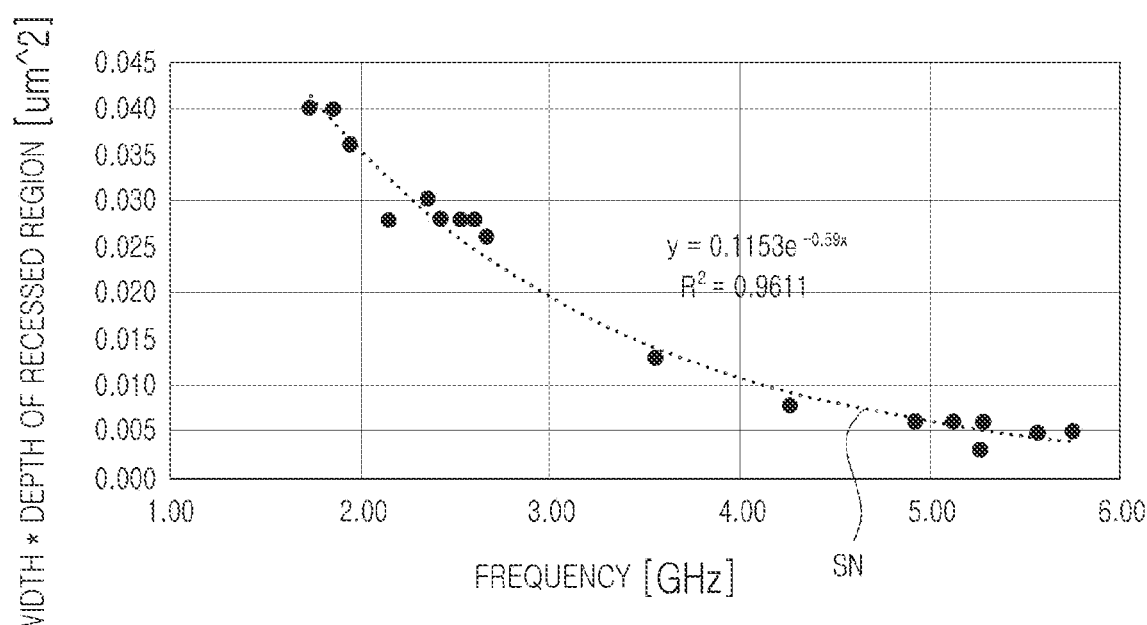
FIG. 11B is a graph illustrating an optimal area according to a resonance frequency of a recess region of the first and/or second electrode.

FIG. 11B is a graph illustrating an optimal area according to a resonance frequency of a recess region of the first and/or second electrode.

Referring to FIG. 11B, a curve SN of the optimal area (width×depth) of the recess region of the first and/or second electrode may be an exponential function of the resonance frequency, and may be a curve approximated based on a number of large points (data according to production). Values in FIG. 11B are values based on the resonator having a width in a horizontal direction of 4900 $(\mu m)^2$.

Accordingly, $[\{\ln(D*W)\}/\{-0.59*F\}]$ of the recess region of the first and/or second electrode of the bulk acoustic resonator according to an embodiment of the present disclosure may be $[[\ln\{0.008\ (\mu m)^2\}]/\{-0.59*(3.5\ GHz)\}]$ or more and $[[\ln\{0.022\ (\mu m)^2\}]/\{-0.59*(3.5\ GHz)\}]$ or less. Here, F may denote the resonance frequency of the bulk acoustic resonator, and can be determined based on a dimension of the resonator of the bulk acoustic resonator. ln is a natural logarithm. Accordingly, the bulk acoustic resonator according to an embodiment of the present disclosure may have improved performance (e.g., spurious noise reduction, sharpness of a resonance frequency, etc.) over a wide frequency range.

FIG. 12 is a graph illustrating spurious noise according to a width of a recess region.

Figure 12A:
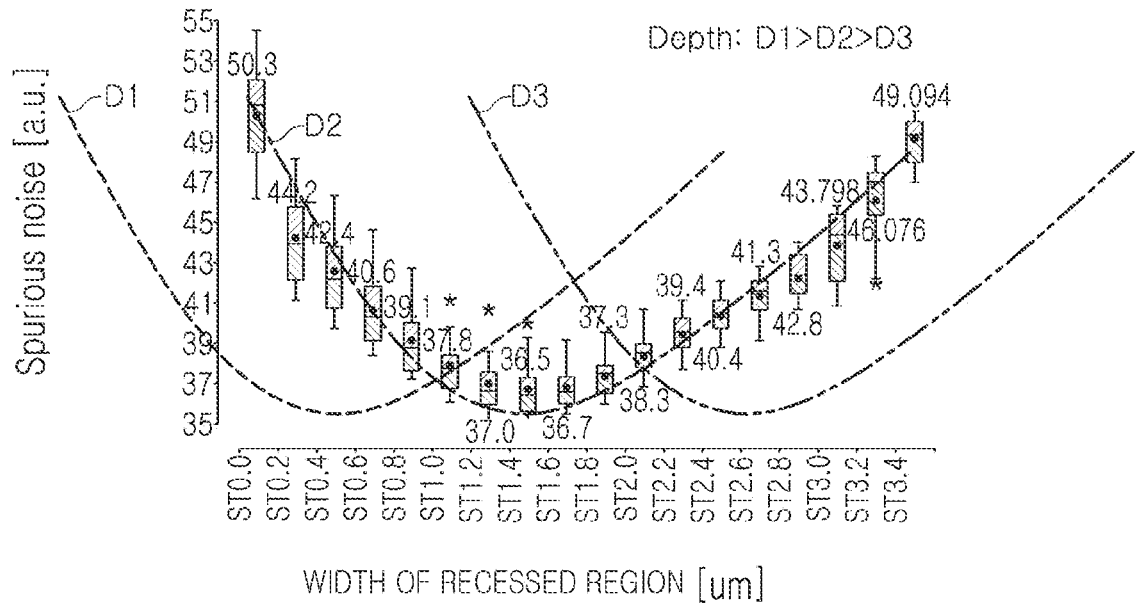
FIG. 12A is a graph illustrating spurious noise according to the width of a recess region.

Referring to FIG. 12A, when a depth D2 of a recess region of a first and/or a second electrode is 8 nm, spurious noise may be lowest when the width of the recess region is 1.4 μm. The width of the recess region in which spurious noise is the lowest may be shorter when the recess region has a long depth D1, and may be longer when the recess region has a short depth D3.

For example, when the depth of the recess region of the first and/or second electrode is 10 nm, an optimal width of the recess region may be 3.6 μm. For example, when the depth of the recess region of the first and/or second electrode is 20 nm, the optimal width of the recess region may be 1.8 μm.

Figure 12B:
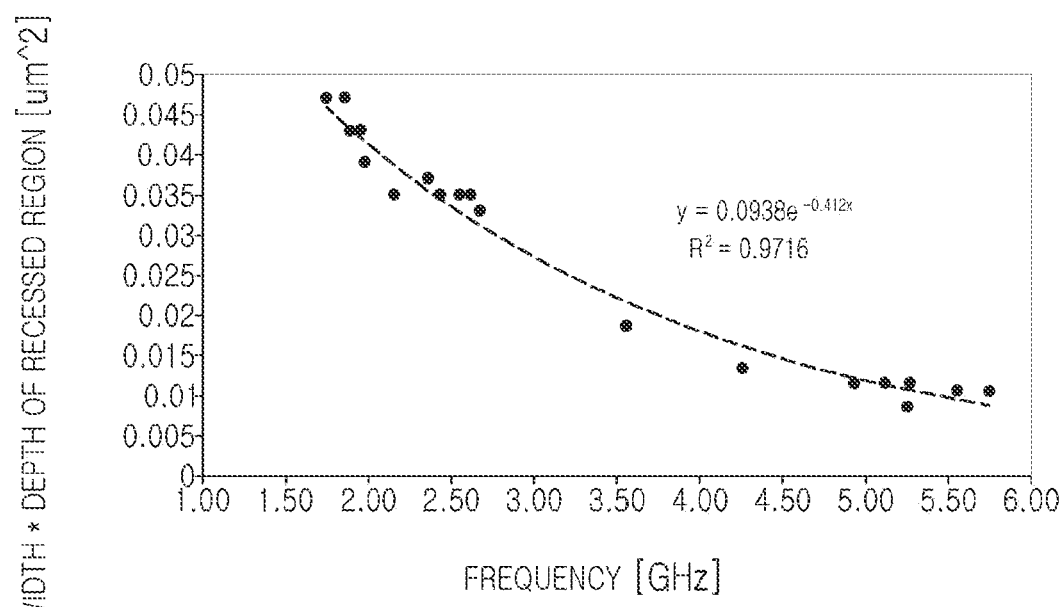
FIG. 12B is a graph illustrating an optimal area of a recess region of a piezoelectric layer according to a resonance frequency.

FIG. 12B is a graph illustrating an optimal area of a recess region of a piezoelectric layer according to a resonance frequency.

Referring to FIG. 12B, a curve SN of an optimal area (width×depth) of a recess region of a piezoelectric layer may be an exponential function of a resonance frequency, and may be a curve approximated based on a number of large points (data according to production). A value of FIG. 12B are values based on a resonance frequency having a width of 4900 $(\mu m)^2$ in a horizontal direction.

Therefore, $[\{\ln(D*W)\}/\{-0.412*F\}]$ of the recess region of the bulk acoustic resonator according to an embodiment of the present disclosure may be $[[\ln\{0.015\ (\mu m)^2\}]/\{-0.412*(3.5\ GHz)\}]$ or more and $[[\ln\{0.015\ (\mu m)^2\}]/\{-0.412*(3.5\ GHz)\}]$ or less. Accordingly, the bulk acoustic resonator according to an embodiment of the present disclosure may have improved performance (e.g., spurious noise reduction, sharpness of a resonance frequency, and the like) over a wide frequency range.

Figure 13:
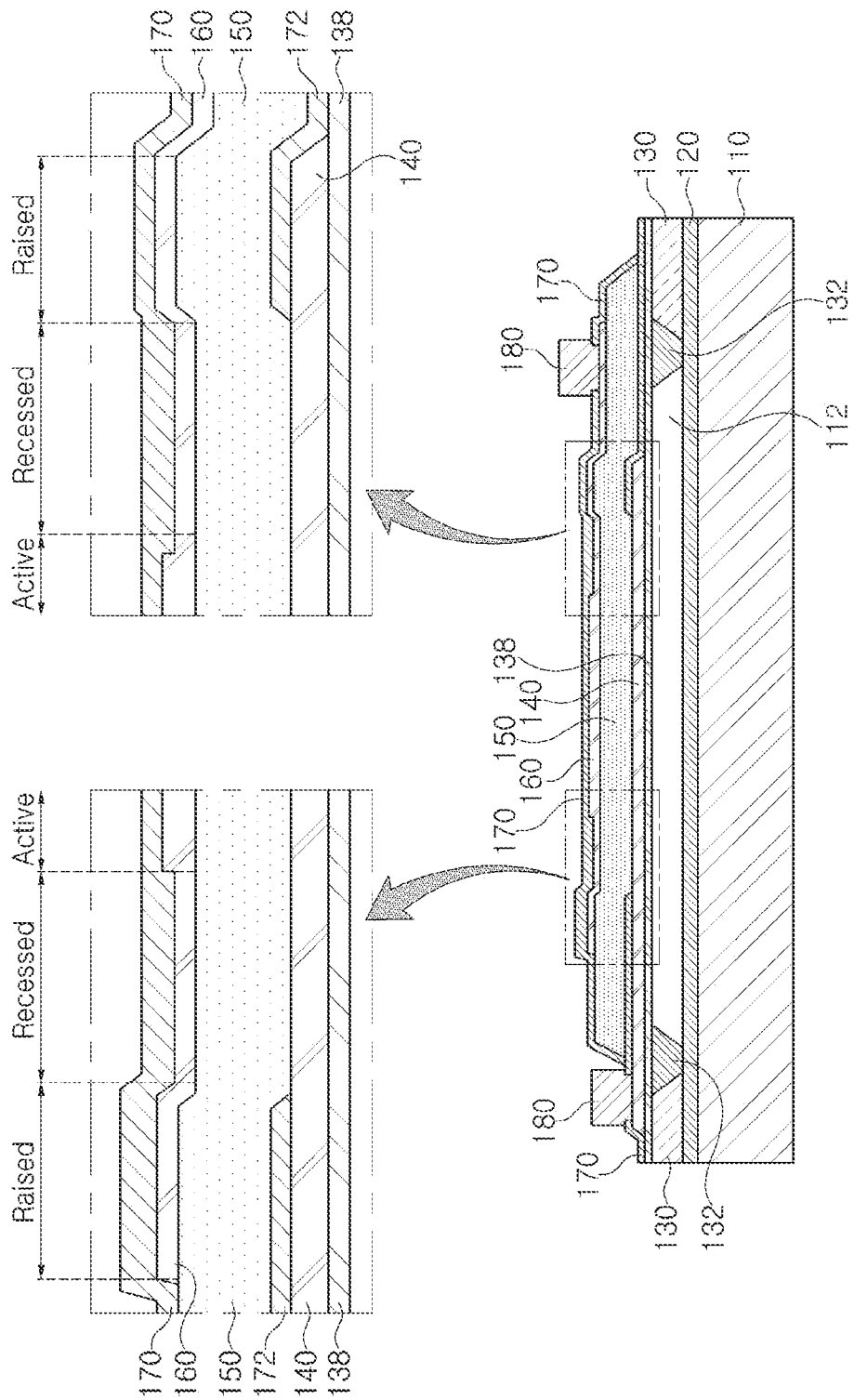
FIG. 13 is a view illustrating a specific form of a bulk acoustic resonator according to an embodiment of the present disclosure.

FIG. 13 is a view illustrating a specific form of a bulk acoustic resonator according to an embodiment of the present disclosure.

Referring to FIG. 13, a bulk acoustic resonator according to an embodiment of the present disclosure may include at least a portion of a substrate 110, a cavity 112, an insulating layer 120, a sacrificial layer 130, an etch stop layer 132, a seed layer 138, a first electrode 140, a piezoelectric layer 150, a second electrode 160, a protective layer 170, an insertion layer 172, and a metal pad 180. At least a portion of the structure shown in FIG. 13 may have the same material as at least a portion of the structure of the bulk acoustic resonator shown in FIG. 1, or may be formed by the same or similar process as the process of forming at least a portion of the structure of the bulk acoustic resonator shown in FIG. 1.

The piezoelectric layer 150, the second electrode 160, and/or the protective layer 170 may include a recess region (Recessed), and may further include a raised region (Raised) and an active region (Active).

The insertion layer 172 may be formed on an upper surface of the first electrode 140 so that the piezoelectric layer 150, the second electrode 160 and/or the protective layer 170 have a recess region. For example, the insertion layer 172 and the etch stop layer 132 may have an insulating material that is the same as or similar to the material of the insulating layer 120, and may be formed in the same or similar process as the process of forming the insulating layer 120.

As set forth above, according to one or more embodiments of the present disclosure, a bulk acoustic resonator may reduce spurious noise of the bulk acoustic resonator, may form a resonance frequency of the bulk acoustic resonator more sharply, and may reduce an insertion loss near the resonance frequency. Accordingly, a skirt characteristic of a filter including a bulk acoustic resonator may be improved, and an energy loss (e.g., insertion loss and return loss) may be further reduced.

While specific example embodiments have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic resonator, comprising:
   a first electrode disposed on an upper side of a substrate;
   a piezoelectric layer disposed on an upper surface of the first electrode; and
   a second electrode disposed on an upper surface of the piezoelectric layer,
   wherein an upper surface of at least one of the first electrode and the second electrode has a recess region,
   wherein a depth of the recess region is D, a width of the recess region is W, and a resonance frequency is F, and ln is a natural logarithm, and
   wherein $[\{\ln(D*W)\}/(-0.59*F)]$ is within a range of $[[\ln\{0.008\ (\mu m)^2\}]/\{-0.59*(3.5\ GHZ)\}]$ to $[[\ln\{0.022\ (\mu m)^2\}]/\{-0.59*(3.5\ GHZ)\}]$.

2. The bulk acoustic resonator of claim 1, wherein D*W is 0.008 $(\mu m)^2$ or more and 0.022 $(\mu m)^2$ or less.

3. The bulk acoustic resonator of claim 2, wherein D*W is 0.010 $(\mu m)^2$ or more and 0.016 $(\mu m)^2$ or less.

4. The bulk acoustic resonator of claim 1, wherein D is 5 nm or more.

5. The bulk acoustic resonator of claim 1, wherein D is 1% or more of a thickness of the piezoelectric layer.

6. The bulk acoustic resonator of claim 1, wherein the recess region is located on an upper surface of the second electrode, and
wherein D is 5/174 times a thickness of the second electrode or more and less than a thickness of the second electrode.

7. The bulk acoustic resonator of claim 1, wherein each of the first electrode and the second electrode comprises molybdenum (Mo).

8. The bulk acoustic resonator of claim 1, wherein the upper surface of the piezoelectric layer has a recess region, and
wherein a product of depth and width of the recess region of at least one of the first electrode and the second electrode is less than a product of depth and width of the recess region of the piezoelectric layer.

9. The bulk acoustic resonator of claim 8, further comprising a protective layer disposed on the upper surface of the second electrode,
wherein an upper surface of the protective layer has a recess region, and
wherein the product of depth and width of the recess region of the piezoelectric layer is less than a product of depth and width of the recess region of the protective layer.

10. The bulk acoustic resonator of claim 9, further comprising a seed layer disposed on the lower surface of the first electrode,
wherein an upper surface of the seed layer has a recess region, and
wherein the product of a depth and a width of a recess region of the protective layer is less than a product of a depth and a width of the recess region of the seed layer.

11. The bulk acoustic resonator of claim 10, wherein the seed layer comprises AlN, and
wherein the protective layer comprises $SiO_2$.

12. A bulk acoustic resonator, comprising:
a first electrode disposed on an upper side of a substrate;
a piezoelectric layer disposed on an upper surface of the first electrode; and
a second electrode disposed on an upper surface of the piezoelectric layer,
wherein the upper surface of the piezoelectric layer has a recess region,
wherein a depth of the recess region is D, a width of the recess region is W, a resonance frequency is F, and ln is a natural logarithm,
wherein D is 1% or more and less than 100% of a thickness of the piezoelectric layer, and
wherein [{ln(D*W)}/(−0.412*F)] is within a range of [[ln{0.015 (μm)$^2$}]/{−0.412*(3.5 GHZ)}] to [[ln{0.03 (μm)$^2$}]/{−0.412*(3.5 GHZ)}].

13. The bulk acoustic resonator of claim 12, wherein D*W is 0.015 (μm)$^2$ or more and 0.03 (μm)$^2$ or less.

14. The bulk acoustic resonator of claim 12, further comprising a protective layer disposed on the upper surface of the second electrode,
wherein an upper surface of the protective layer has a recess region, and
wherein a product of depth and width of the recess region of the piezoelectric layer is less than a product of depth and width of the recess region of the protective layer.

15. The bulk acoustic resonator of claim 12, further comprising a seed layer disposed on the lower surface of the first electrode,
wherein an upper surface of the seed layer has a recess region, and
wherein a product of depth and width of the recess region of the piezoelectric layer is less than a product of depth and width of the recess region of the seed layer.

16. A bulk acoustic resonator, comprising:
a seed layer;
a first electrode disposed on an upper surface of the seed layer;
a piezoelectric layer disposed on an upper surface of the first electrode;
a second electrode disposed on an upper surface of the piezoelectric layer; and
a protective layer disposed on an upper surface of the second electrode,
wherein upper surfaces of at least two of the seed layer, the first electrode, the piezoelectric layer, the second electrode, and the protective layer have first and second recess regions having different products of depth and width, respectively.

17. The bulk acoustic resonator of claim 16, wherein the first recess region is located on an upper surface of at least one of the first electrode and the second electrode,
wherein the second recess region is located on an upper surface of at least one of the seed layer, the piezoelectric layer, and the protective layer, and
wherein a product of depth and width of the first recess region is less than a product of depth and width of the second recess region.

18. The bulk acoustic resonator of claim 17, wherein each of the first electrode and the second electrode comprises molybdenum (Mo), and
wherein at least one of the seed layer, the piezoelectric layer, and the protective layer comprises at least one of AlN, ScAlN, and $SiO_2$.

19. The bulk acoustic resonator of claim 16, wherein the first recess region is located on an upper surface of at least one of the first electrode, the piezoelectric layer, and the second electrode,
wherein the second recess region is located on an upper surface of at least one of the seed layer and the protective layer, and
wherein a product of depth and width of the first recess region is less than a product of depth and width of the second recess region.

20. The bulk acoustic resonator of claim 16, wherein the first recess region is located on an upper surface of at least one of the first electrode, the piezoelectric layer, the second electrode, and the protective layer,
wherein the second recess region is located on the upper surface of the seed layer, and
wherein a product of depth and width of the first recess region is less than a product of depth and width of the second recess region.

21. The bulk acoustic resonator of claim 20, wherein the seed layer comprises AlN, and
wherein the protective layer comprises $SiO_2$.

22. The bulk acoustic resonator of claim 16, wherein the first and second recess regions have different depths.

* * * * *